(12) United States Patent
Kamiya et al.

(10) Patent No.: US 8,879,136 B2
(45) Date of Patent: Nov. 4, 2014

(54) LIGHT DEFLECTOR

(71) Applicant: Olympus Corporation, Tokyo (JP)

(72) Inventors: Yoshitaka Kamiya, Hachioji (JP); Yoshitaka Sakata, Ebina (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/946,072

(22) Filed: Jul. 19, 2013

(65) Prior Publication Data

US 2013/0301102 A1 Nov. 14, 2013

Related U.S. Application Data

(63) Continuation of application No. PCT/JP2012/050831, filed on Jan. 17, 2012.

(30) Foreign Application Priority Data

| Jan. 21, 2011 | (JP) | ................................ | 2011-010664 |
| Aug. 30, 2011 | (JP) | ................................ | 2011-187579 |

(51) Int. Cl.
  *G02B 26/08* (2006.01)
  *B81B 3/00* (2006.01)
(52) U.S. Cl.
  CPC ......... *G02B 26/08* (2013.01); *B81B 2203/0109* (2013.01); *B81B 3/0048* (2013.01); *B81B 2203/0163* (2013.01); *G02B 26/0833* (2013.01); *B81B 2203/058* (2013.01); *B81B 2201/042* (2013.01)
  USPC .................................................... 359/223.1
(58) Field of Classification Search
  CPC ............... G02B 26/08; G02B 26/0825; G02B 26/0833; G02B 26/0841; G02B 26/101
  USPC .............. 359/199.1, 199.2, 212.1–214.1, 359/223.1–226.1
  See application file for complete search history.

(56) References Cited

U.S. PATENT DOCUMENTS

2010/0079835 A1* 4/2010 Yoda et al. ................. 359/199.1

FOREIGN PATENT DOCUMENTS

| JP | 06-046207 A | 2/1994 |
| JP | 2005-517990 A | 6/2005 |
| JP | 2006-039067 A | 2/2006 |
| JP | 2008-052220 A | 3/2008 |
| JP | 2009-080379 A | 4/2009 |

OTHER PUBLICATIONS

International Search Report dated Feb. 21, 2012 issued in PCT/JP2012/050831.
English abstract only of International Publication WO 03-071331 A1, dated Aug. 28, 2003.

* cited by examiner

*Primary Examiner* — Euncha Cherry
(74) *Attorney, Agent, or Firm* — Scully, Scott, Murphy & Presser, P.C.

(57) ABSTRACT

An optical deflector includes a movable portion having a mirror plane, a fixed portion, a pair of combined torsion bars connecting the movable portion and the fixed portion to each other so that the movable portion can be rotationally displaced about a rotation axis with respect to the fixed portion, and a driver to drive the movable portion. Each combined torsion bar includes a plurality of torsion bars extending to be parallel to the rotation axis and a plurality of connecting bars, each of the connecting bars connecting one ends of each adjacent two of the torsion bars to each other. A torsion bar farther from the rotation axis has higher torsional rigidity than a torsion bar closer to the rotation axis.

12 Claims, 17 Drawing Sheets

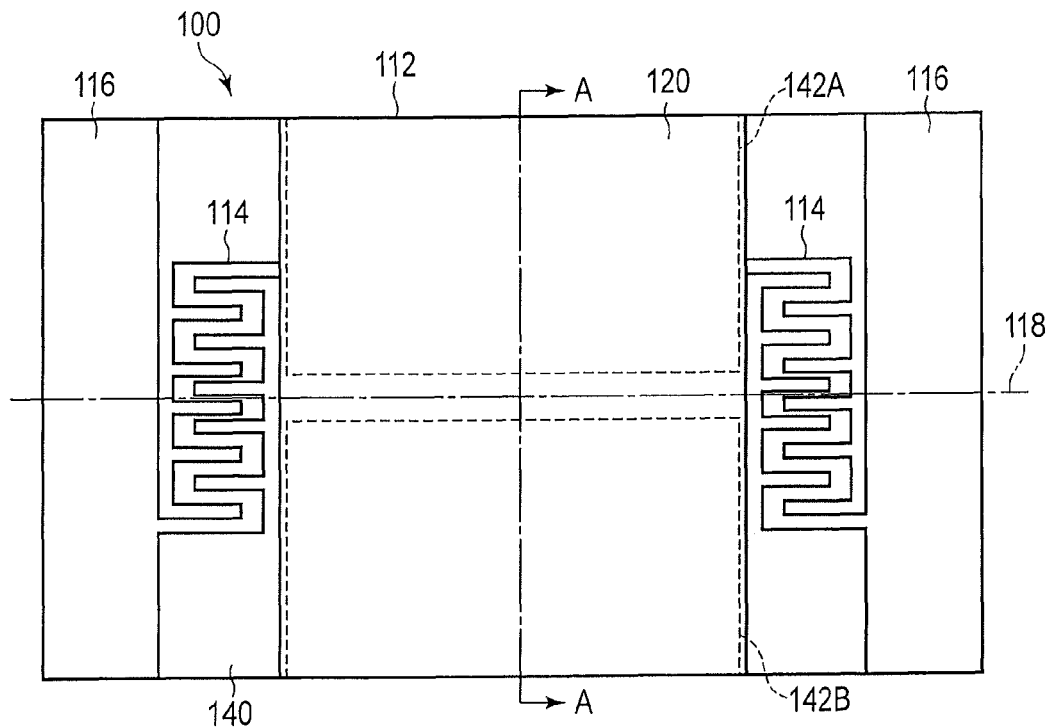
F I G. 2
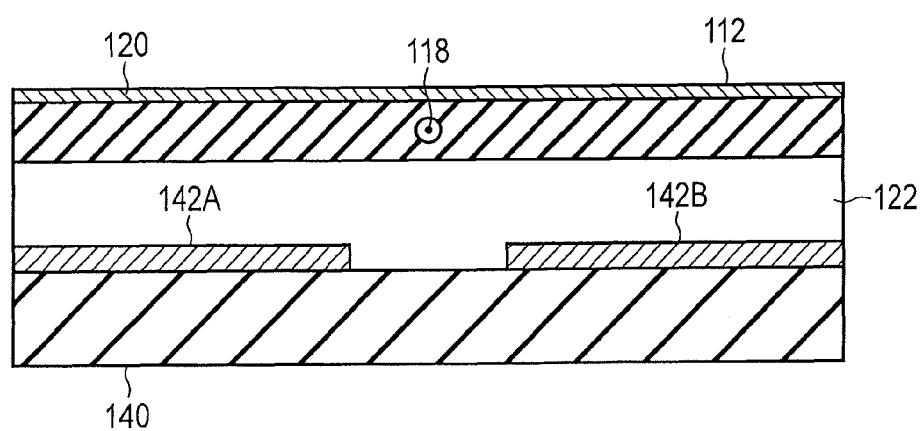
F I G. 3

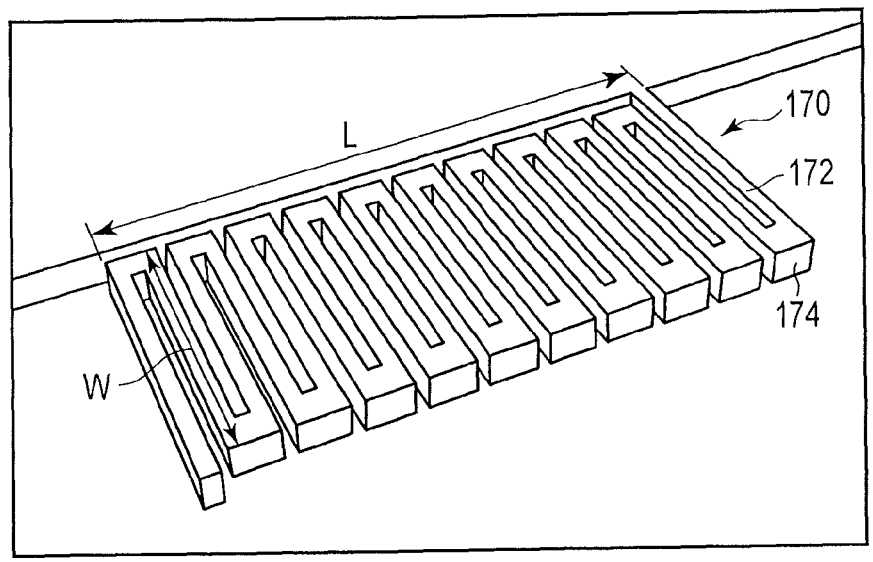
F I G. 9
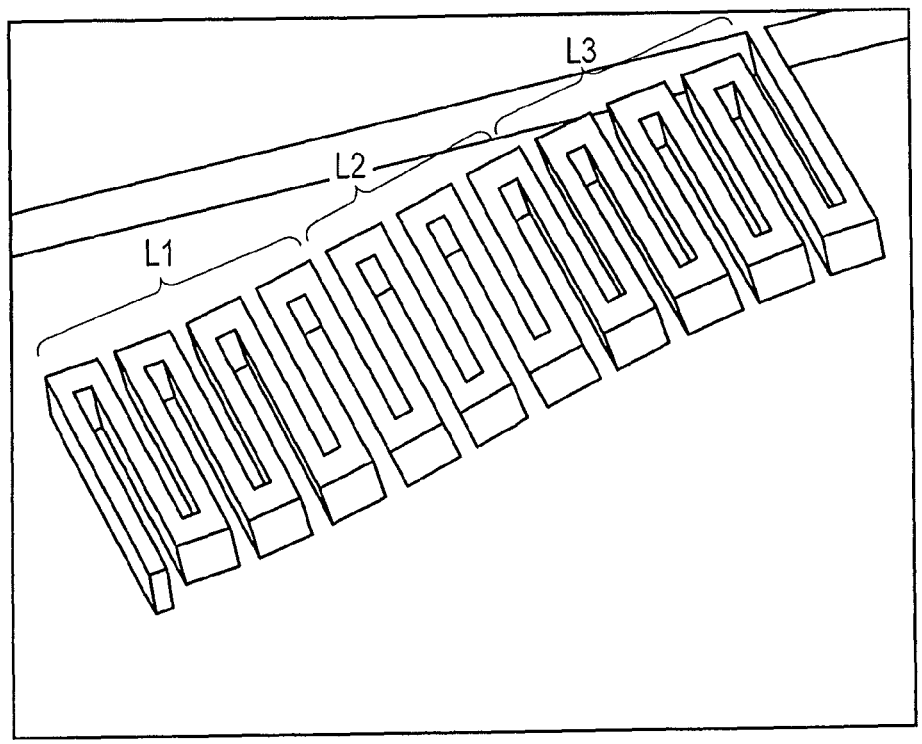
F I G. 10

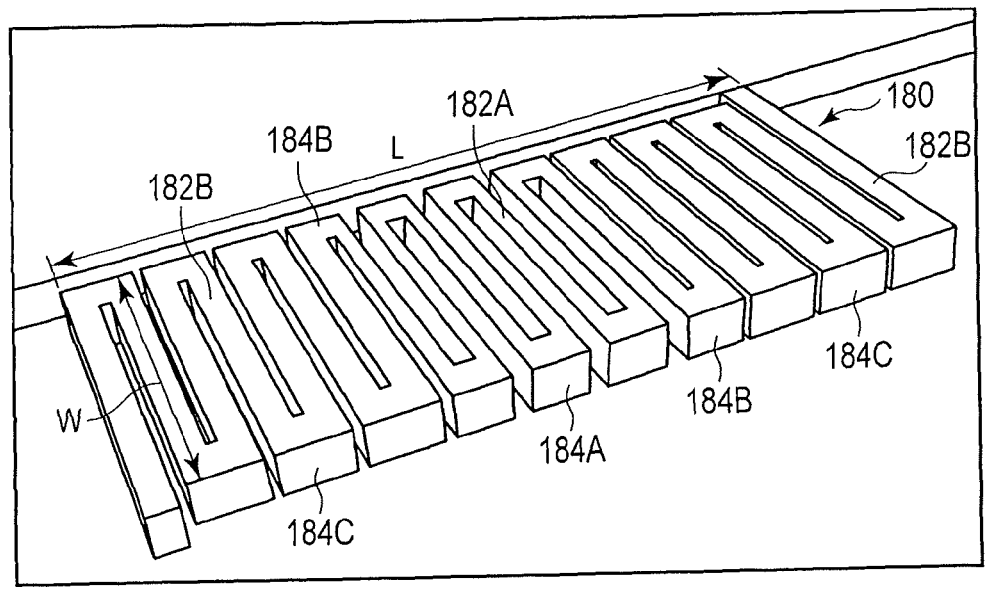
F I G. 11
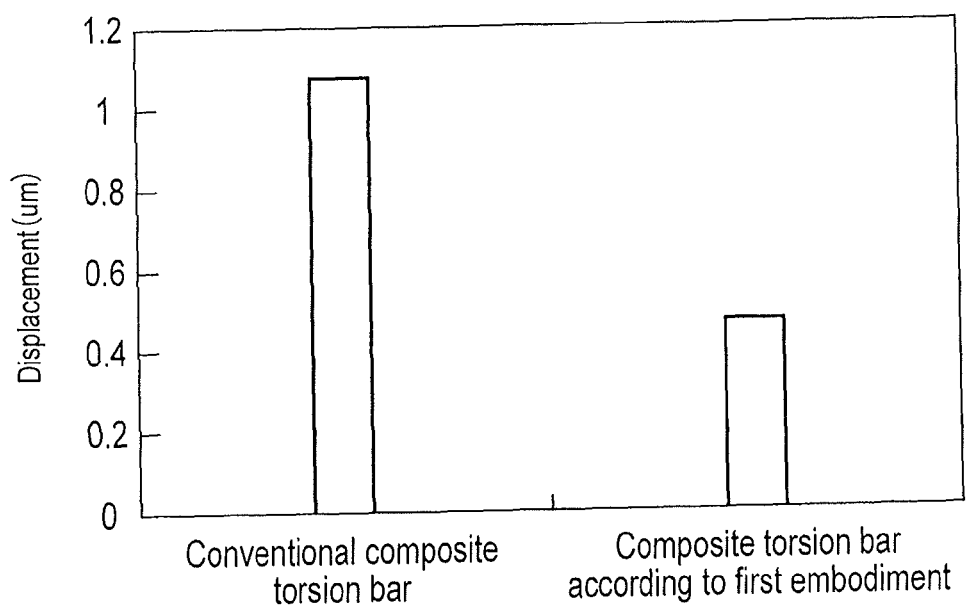
F I G. 12

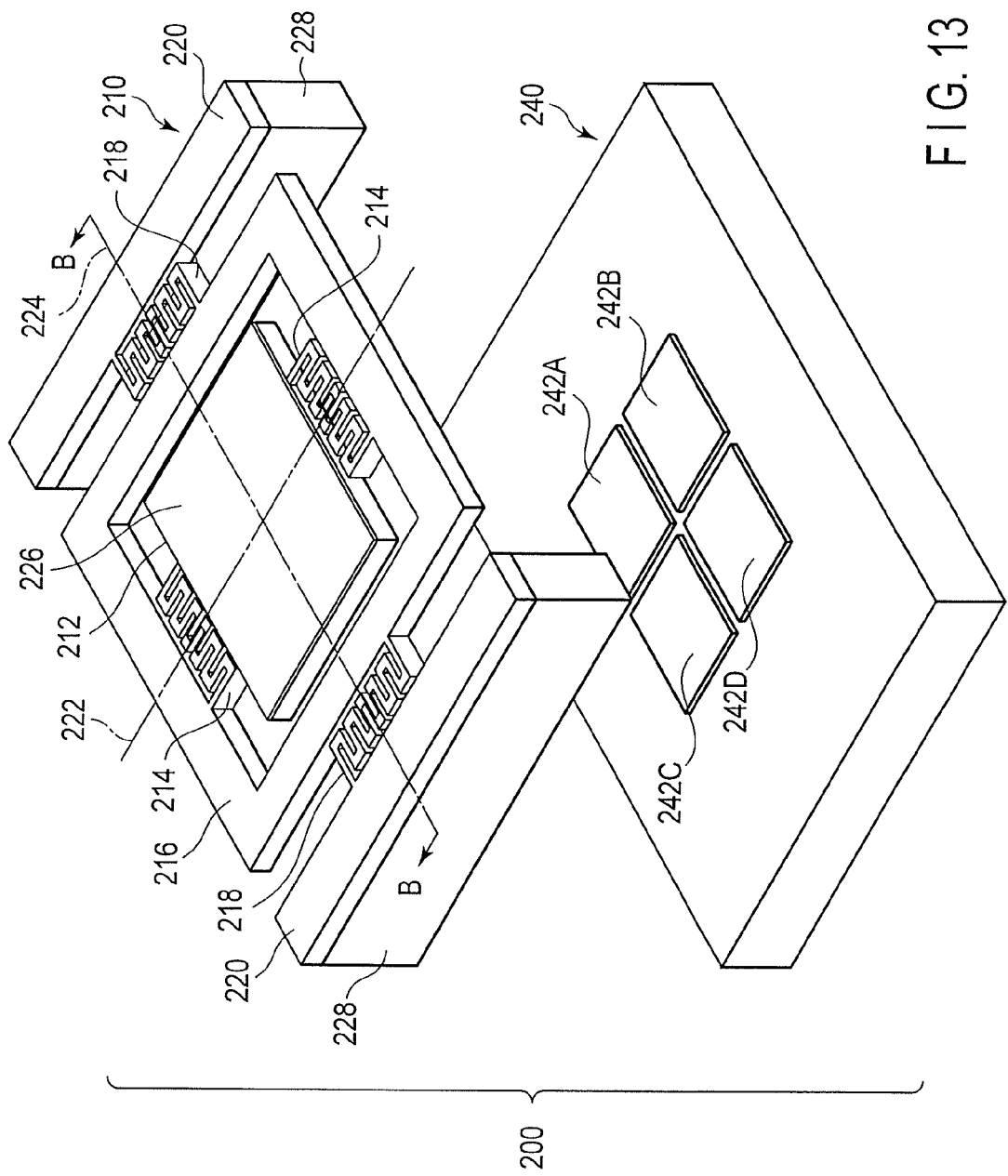
F I G. 13

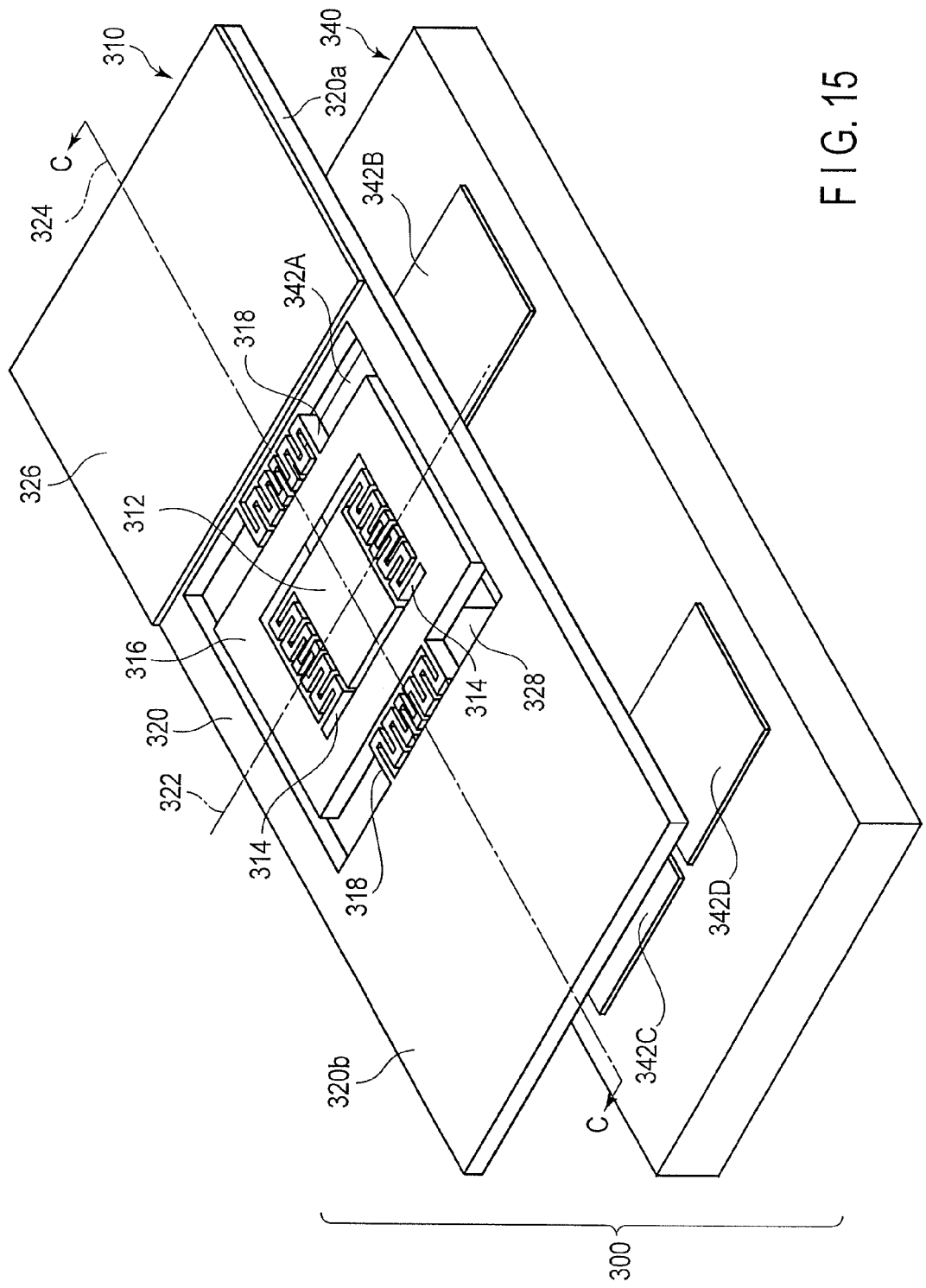
F I G. 15

LIGHT DEFLECTOR

CROSS-REFERENCE TO RELATED APPLICATIONS

This application is a Continuation Application of PCT Application No. PCT/JP2012/050831, filed Jan. 17, 2012 and based upon and claiming the benefit of priority from prior Japanese Patent Applications No. 2011-010664, filed Jan. 21, 2011; and No. 2011-187579, filed Aug. 30, 2011, the entire contents of all of which are incorporated herein by reference.

BACKGROUND OF THE INVENTION

1. Field of the Invention

The present invention relates to an optical deflector to defect light.

2. Description of the Related Art

Japanese Unexamined Patent Application Publication No. 2005-517990 discloses a micro-machined optical deflector. This optical deflector includes a movable portion having a mirror plane, which is rotatably supported by combined torsion bars. Each combined torsion bar includes a plurality of torsion bars arranged in an array form to be parallel to a rotation axis, one end of each torsion bar being connected with one end of another adjacent torsion bar.

In the optical deflector mentioned above, when a load in a mirror plane perpendicular direction, i.e., a direction perpendicular to the mirror plane, is applied to the movable portion due to vibration or the like from its external environment, the movable portion is easy to move in the mirror plane perpendicular direction. To suppress movement of the movable portion in the mirror plane perpendicular direction, an aspect ratio of the torsion bar is adjusted. Specifically, an aspect ratio of the torsion bar relative to a width thereof is set to 1 or more. That is, a thickness dimension of the torsion bar is set to be larger than a width direction of the same, and rigidity of the torsion bar in the mirror plane perpendicular direction is increased, thereby suppressing movement of the movable portion in the mirror plane perpendicular direction. However, this solution method increases the rigidity of the combined torsion bar in the mirror plane perpendicular direction and also increases the rigidity of the combined torsion bar in a movable portion rotating direction. This decreases rotational sensitivity, i.e., drive sensitivity of the movable portion relative to drive force.

In view of the above-described actual situation, an object of the present invention is to provide an optical deflector having improved resistance of a movable portion relative to a load in a mirror plane perpendicular direction.

BRIEF SUMMARY OF THE INVENTION

An optical deflector includes a movable portion having a mirror plane, a fixed portion, a pair of combined torsion bars connecting the movable portion and the fixed portion to each other so that the movable portion can be rotationally displaced about a rotation axis with respect to the fixed portion, and a driver to drive the movable portion. Each combined torsion bar includes a plurality of torsion bars extending to be parallel to the rotation axis and a plurality of connecting bars, each of the connecting bars connecting one ends of each adjacent two of the torsion bars to each other. A torsion bar farther from the rotation axis has higher torsional rigidity than a torsion bar closer to the rotation axis.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a plan view of the optical deflector according to the first embodiment shown in FIG. 1;

FIG. 3 is a cross-sectional view of the optical deflector taken along a line A-A shown in FIGS. 1 and 2;

FIG. 9 is an enlarged view of a conventional combined torsion bar;

FIG. 10 shows stress concentration of the conventional combined torsion bar;

FIG. 11 is an enlarged view of the combined torsion bar according to the first embodiment;

FIG. 12 is a graph comparing displacements of a movable portion when a load is applied in a mirror plane perpendicular direction in an optical deflector to which the conventional combined torsion bar is applied and an optical deflector to which the combined torsion bar according to the first embodiment is applied;

FIG. 13 is a perspective view of an optical deflector according to a first modification of the first embodiment;

FIG. 15 is a perspective view of an optical deflector according to a second modification of the first embodiment;

DETAILED DESCRIPTION OF THE INVENTION

Embodiments according to the present invention will now be described hereinafter with reference to the drawings.

First Embodiment

Figure 1:
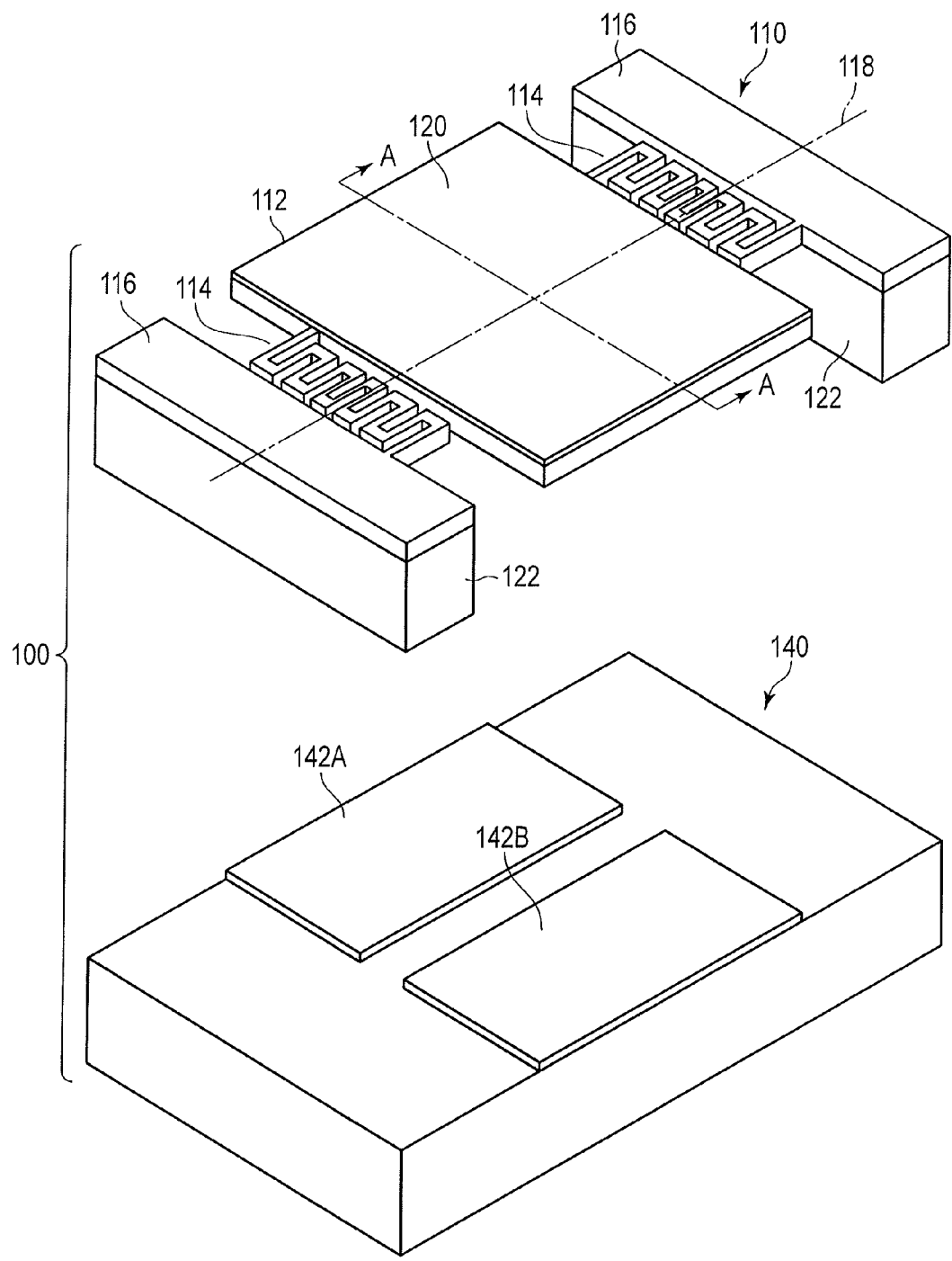
FIG. 1 is a perspective view of an optical deflector according to a first embodiment.
Figure 4:
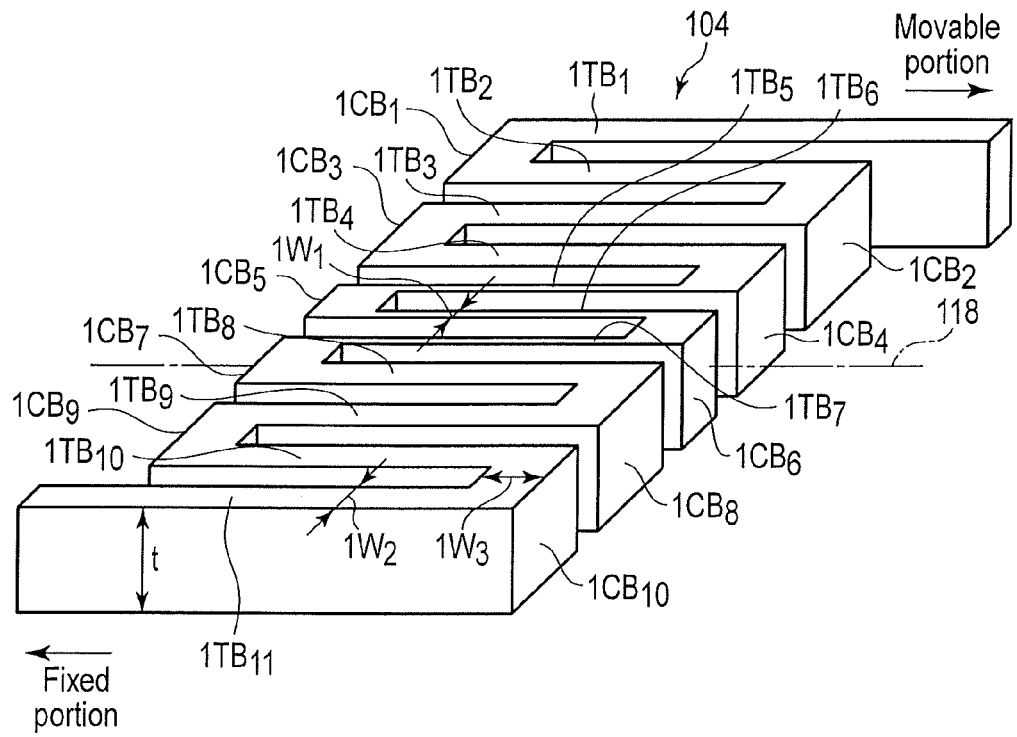
FIG. 4 is a perspective view of a combined torsion bar of the optical deflector according to the first embodiment.

A configuration of an optical deflector according to a first embodiment will be first described with reference to FIGS. 1 to 4. FIG. 1 is a disassembled perspective view of an optical deflector according to the first embodiment. FIG. 2 is a plan view of the optical deflector shown in FIG. 1. FIG. 3 shows a joint cross section of the optical deflector taken along a line A-A shown in FIG. 1. FIG. 4 is an enlarged perspective view of a combined torsion bar of the optical deflector shown in FIG. 1.

An optical deflector 100 comprises a mirror unit 110 and an electrode substrate 140.

The mirror unit 110 comprises a movable portion 112, a pair of combined torsion bars 114, and a pair of fixed portions 116. The movable portion 112 has a rectangular shape. The shape of the movable portion 112 is not limited to the rectangular shape, and any other arbitrary shape such as a circular shape or an elliptic shape may be adopted. The pair of fixed portions 116 are positioned on both sides of the movable portion 112 at an interval, and the pair of combined torsion bars 114 are positioned between the movable portion 112 and the pair of fixed portions 116. The pair of combined torsion bars 114 are positioned on both sides of the movable portion 112. The pair of combined torsion bars 114 mechanically connect the movable portion 112 and the fixed portions 116 to each other so that the movable portion 112 can be rotationally displaced, i.e., inclined about a rotation axis 118 with respect to the fixed portions 116. The movable portion 112, the combined torsion bars 114, and the fixed portions 116 may be integrally made of, e.g., silicon. The movable portion 112 has a mirror plane 120 on a surface on the opposite side of a surface facing the electrode substrate 140. The mirror plane 120 may be formed by, e.g., forming a metal thin film with high reflectance on the movable portion 112. Alternatively, the mirror plane 120 may be formed by mirror-polishing a surface of the movable portion 112. Each fixed portion 116 is provided, on a surface facing the electrode substrate 140, with a spacer 122 to define an interval between the movable portion 112 and the electrode substrate 140.

The electrode substrate 140 is provided, on a surface facing the movable portion 112, with a pair of fixed electrodes 142A, 142B configured to rotationally displace, namely, incline the movable portion 112 about the rotation axis 118. That is, the fixed electrodes 142A, 142B constitute a driver to drive the movable portion 112. This driver can drive the movable portion 112 by using electrostatic force. In the following description, both the fixed electrodes 142A, 142B will be generically simply referred to as fixed electrodes 142 when they do not have to be distinguished from each other. The fixed electrodes 142 are made of, but not limited to, e.g., gold.

The mirror unit 110 and the electrode substrate 140 are arranged so that the movable portion 112 faces the fixed electrodes 142, and the spacers 122 are joined to the electrode substrate 140. As a result, the fixed electrodes 142 are arranged at positions overlapping the movable portion 112 as viewed from a front direction of the movable portion 112 as shown in FIG. 2, and they are arranged apart from the movable portion 112 as viewed from a side direction of the movable portion 112 as shown in FIG. 3. Here, the front direction of the movable portion 112 means a direction perpendicular to the mirror plane 120 of the movable portion 112 with no deflection, and the side direction of the movable portion 112 means a direction parallel to the mirror plane 120 of the movable portion 112 with no deflection.

The pair of combined torsion bars 114 and the pair of fixed portions 116 are arranged to be line-symmetric with respect to a straight line that runs through the center of the movable portion 112 and is perpendicular to the rotation axis 118 in the plane, e.g., a line A-A.

In such an optical deflector 100, the movable portion 112 is driven as follows. The movable portion 112 is maintained at a ground potential, and a voltage is applied to one of the pair of fixed electrodes 142 on the electrode substrate 140, e.g., the fixed electrode 142A. Electrostatic attractive force is generated between the fixed electrode 142A to which the voltage has been applied and the movable portion 112. Intensity of the generated electrostatic attractive force is dependent on intensity of the applied voltage. The side of the movable portion 112 that faces the fixed electrode 142 to which the voltage has been applied is attracted to the electrode substrate 140, and the side of the same facing the fixed electrode 142B to which no voltage has been applied is moved away from the electrode substrate 140. As a result, the combined torsion bars 114 undergo torsion deformation, so that the movable portion 112 is rotationally displaced, i.e., inclined about the rotation axis 118 depending on the intensity of the applied voltage. As a result, a beam of light reflected by the mirror plane 120 can be one-dimensionally deflected.

As shown in FIG. 4, each combined torsion bar 114 comprises an odd number of torsion bars $1TB_1$-$1TB_{11}$ and a plurality of connecting bars $1CB_1$-$1CB_{10}$. The torsion bars $1TB_1$-$1TB_{11}$ extend to be parallel to each other. Each of the connecting bars $1CB_1$-$1CB_{10}$ connects one ends of each adjacent two of the torsion bars $1TB_1$-$1TB_{11}$ to each other. That is, the connecting bar $1CB_n$ (n is a natural number that is not greater than 10) connects one ends of the two torsion bars $1TB_n$, $1TB_{n+1}$ to each other. The other ends of the two torsion bars $1TB_1$, $1TB_{11}$ positioned on the outermost side, i.e., ends that are not connected to the connecting bars $1CB_1$, $1CB_{10}$ are connected to the movable portion 112 and the fixed portion 116, respectively. The torsion bars $1TB_1$-$1TB_{11}$ and the connecting bars $1CB_1$-$1CB_{10}$ may be integrally made of, e.g., silicon.

The torsion bars $1TB_1$-$1TB_{11}$ extend to be parallel to the rotation axis 118, and they are aligned in the direction perpendicular to the rotation axis 118. The connecting bars $1CB_1$-$1CB_{10}$ extend in the alignment direction of the torsion bars $1TB_1$-$1TB_{11}$. Here, the terms "parallel" and "vertical" are not strictly limited to precise parallelism and verticality, and a range that apparent parallelism and verticality can be recognized by a commonsense judgment in this field is allowed. For example, parallelism may fall within the range of 0±3 degrees, verticality may fall within the range of 90±3 degrees.

The torsion bars $1TB_1$-$1TB_{11}$ are symmetrically arranged in the alignment direction with the rotation axis 118 at the center. That is, the torsion bars $1TB_1$-$1TB_5$ and the torsion bars $1TB_{11}$-$1TB_7$ are symmetrically arranged with $1TB_6$ positioned on the rotation axis 118 at the center. In the torsion bars $1TB_1$-$1TB_{11}$, a torsion bar farther from the rotation axis 118 has higher torsion rigidity than a torsion bar closer to the rotation axis 118.

The torsion bars $1TB_1$-$1TB_{11}$ and the connecting bars $1CB_1$-$1CB_{10}$ all have the same thickness t. The torsion bars $1TB_5$-$1TB_7$ positioned at a central portion have a width $1W_1$, and the torsion bars $1TB_1$-$1TB_4$, $1TB_8$-$1TB_{11}$ positioned on both sides have a width $1W_2$. The connecting bars $1CB_1$-

$1CB_{10}$ all have a width $1W_3$. $1W_2$ is larger than $1W_1$, and $1W_3$ is equal to or larger than $1W_2$. t is larger than $1W_2$.

Each combined torsion bar 114 has three regions that are divided in accordance with differences between widths of the torsion bars $1TB_1$-$1TB_{11}$ and aligned in the alignment direction of the torsion bars $1TB_1$-$1TB_{11}$. The three regions include a central region or a first region positioned at the center and a pair of lateral regions or second and third regions symmetrically arranged on both sides of the central region. The central region or the first region includes the torsion bars $1TB_5$-$1TB_7$, one lateral region or the second region includes the torsion bars $1TB_1$-$1TB_4$, and the other lateral region or the third region includes the torsion bars $1TB_8$-$1TB_{11}$. The torsion bars $1TB_1$-$1TB_4$, $1TB_5$-$1TB_7$, $1TB_8$-$1TB_{11}$ in each region have the same torsional rigidity. The torsion bars $1TB_1$-$1TB_4$ in the second region and the torsion bars $1TB_8$-$1TB_{11}$ in the third region have the higher torsional rigidity than that of the torsion bars $1TB_5$-$1TB_7$ in the first region. In other words, the torsional rigidity of the torsion bars $1TB_1$-$1TB_{11}$ of each combined torsion bar 114 has a discrete distribution in the alignment direction of the torsion bars $1TB_1$-$1TB_{11}$.

Figure 5:
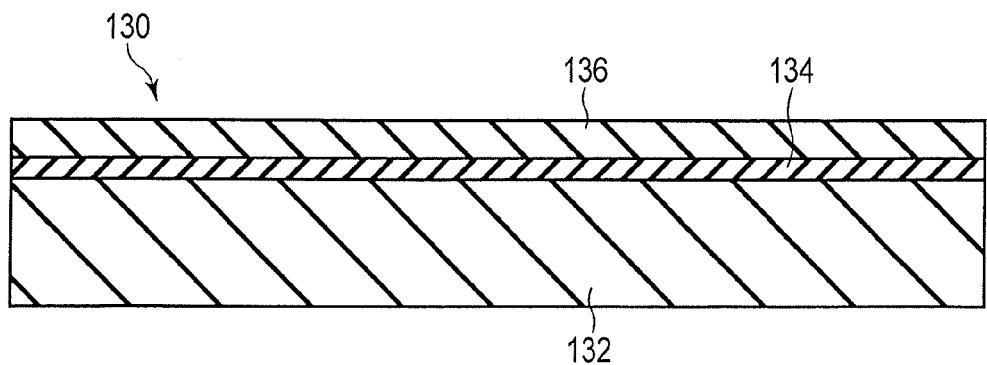
FIG. 5 shows a process of a fabricating method of a mirror unit in the optical deflector according to the first embodiment.
Figure 6:
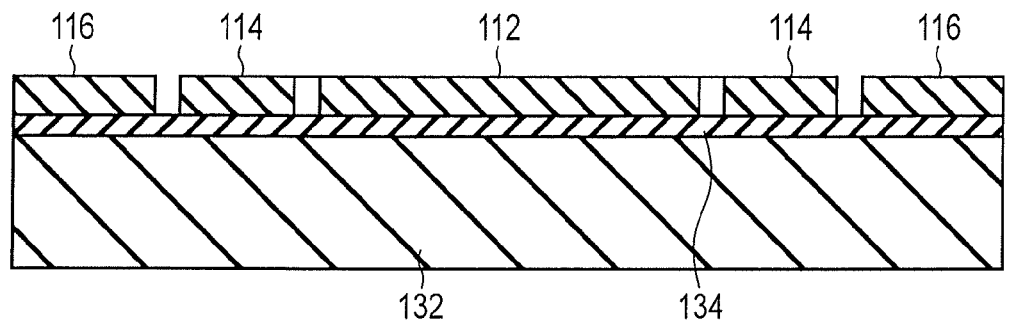
FIG. 6 shows a process following the FIG. 5 process of the fabricating method of the mirror unit in the optical deflector according to the first embodiment.
Figure 7:
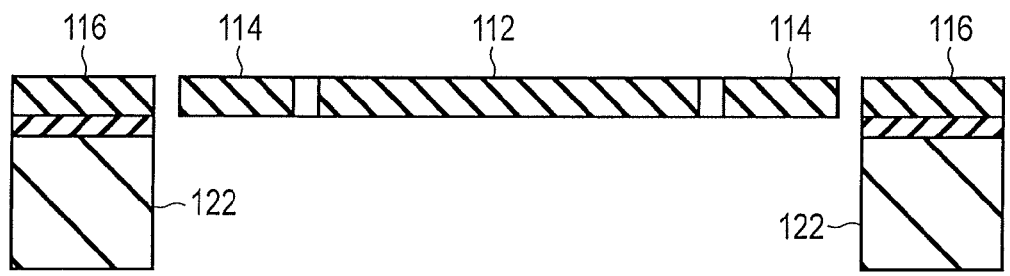
FIG. 7 shows a process following the FIG. 6 process of the fabricating method of the mirror unit in the optical deflector according to the first embodiment.

A fabrication method of the mirror unit 110 will now be described with reference to FIGS. 5 to 7. FIGS. 5 to 7 show a series of steps in the fabrication method of the mirror unit 110.

First, as shown in FIG. 5, an SOI wafer 130 is prepared as a start wafer. The SOI wafer 130 is constituted of a silicon support layer 132, a silicon oxide film layer 134, and a silicon active layer 136.

Then, as shown in FIG. 6, photo-etching is performed from the silicon active layer 136 side, so as to selectively etch the silicon active layer 136, so that the movable portion 112, the combined torsion bars 114, and the fixed portions 116 are formed. As an etching apparatus, for example, an anisotropic dry etching apparatus is used.

Subsequently, as shown in FIG. 7, photo-etching is performed from the silicon support layer 132 side, so that the silicon support layer 132 is selectively etched except portions corresponding to the fixed portions 116, and the silicon oxide film layer 134 is further etched. Here, as an etching apparatus, for example, an anisotropic dry etching apparatus is likewise used.

At last, although not shown, the mirror plane 120 is formed by forming a film of a metal material with high reflectance on the movable portion 112 with use of a deposition apparatus from the silicon active layer 136 side, so that the mirror unit 110 is completed.

An optical deflector with conventional combined torsion bars is compared with an optical deflector with the combined torsion bars according to this embodiment with reference to FIG. 8 to FIG. 12.

Figure 8:
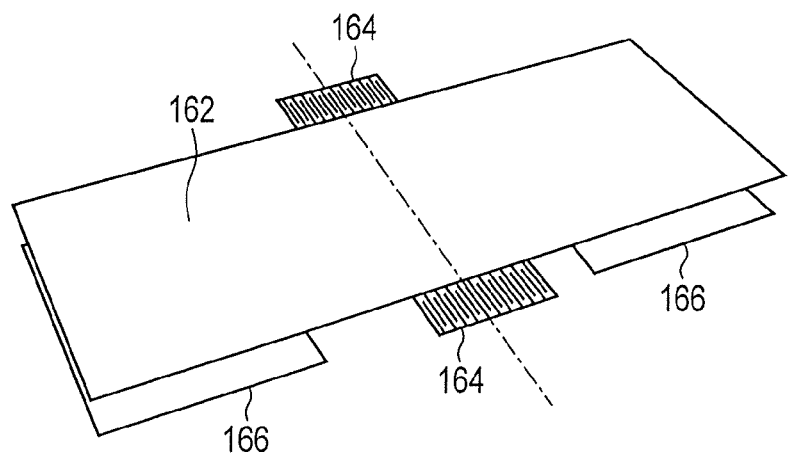
FIG. 8 shows an analysis model for the optical deflector.

FIG. 8 shows an analysis model of the optical deflector used for comparison. In this analysis model, both the movable portion 162 and the combined torsion bars 164 are made of silicon. The movable portion 162 has a length of 500 µm, a width of 200 µm, and a thickness of 5 µm. Each fixed electrode 166 is made of gold and arranged at an interval of 30 µm from the movable portion 162. Each fixed electrode 166 has a length of 150 µm and a width of 200 µm.

FIG. 9 is an enlarged view of the conventional combined torsion bar applied to the combined torsion bar 164 shown in FIG. 8. The combined torsion bar 170 comprises 21 torsion bars 172 and 20 connecting bars 174. Each torsion bar 172 has a length of 31 µm, a width of 2 µm, and a thickness of 5 µm. Each connecting bar 174 has a length of 6 (=2+2+2) µm, a width of 3 µm, and a thickness of 5 µm. A total length L of the combined torsion bar 170 is 80 µm, and a total width W of the same is 40 µm.

FIG. 10 shows a result of analyzing a stress applied to the combined torsion bar 164 when a load is applied to the movable portion 162 along a direction of each fixed electrode 166. According to this result, it is understood that, when the movable portion 162 has moved in the direction of each fixed electrode 166, the stress received by each of portions L1, L3 of the combined torsion bar 164 farther from the rotation axis 118 is high and the stress received by the portion L2 of the combined torsion bar 164 closer to the rotation axis 118 is small. That is, this means that torsion of the torsion bar 172 positioned away from the rotation axis 118 is large whereas torsion of the torsion bar 172 positioned near the rotation axis 118 is small.

FIG. 11 is an enlarged view of a combined torsion bar according to this embodiment that is applied to the combined torsion bar 164 shown in FIG. 8. A combined torsion bar 180 comprises 21 torsion bars 182A, 182B and 20 connecting bars 184A, 184B, 184C. The combined torsion bar 180 is divided into a central region and a pair of lateral regions on both sides in accordance with a difference between widths of the torsion bars 182A, 182B, the torsion bar 182A in the central region has a length of 31 µm, a width of 1.5 µm, and a thickness of 5 µm, and a torsion bar 182B in a lateral region has a length of 31 µm, a width of 3 µm, and a thickness of 5 µm. Further, a connecting bar 184A connecting the torsion bars 182A to each other has a length of 5.5 (=1.5+2.5+1.5) µm, a width of 3 µm, and a thickness of 5 µm, a connecting bar 184B connecting the torsion bars 182A, 182B to each other has a length of 5.5 (=1.5+1+3) µm, a width of 3 µm, and a width of 5 µm, and a connecting bar 184C connecting the torsion bars 182B to each other has a length of 7 (=3+1+3) µm, a width of 3 µm, and a thickness of 5 µm. It is to be noted that, with regard to the connecting bars 184A, 184B, 184C, the length is a dimension in the alignment direction of the torsion bars 182A, 182B and the width is a dimension in the extending direction of the torsion bars 182A, 182B. A total length L of the combined torsion bar 180 is 82 µm, and a total width W of the same is 40 µm.

FIG. 12 shows a result of analyzing a displacement of the movable portion 162 in the perpendicular direction when a load 200G is applied to the movable portion 162 in the perpendicular direction with respect to each of the optical deflector to which the combined torsion bar 170 shown in FIG. 9 is applied and the optical deflector to which the combined torsion bar 180 shown in FIG. 11 is applied as an example. Consequently, it is understood that the displacement is reduced approximately 40% in the optical deflector to which the combined torsion bar 180 according to this embodiment is applied as compared with the optical deflector to which the conventional combined torsion bar 170 is applied.

It is to be noted that, although not shown, deflection angle characteristics relative to a drive voltage concerning a rotating direction, i.e., drive sensitivity is substantially the same.

That is, torsional rigidity of torsion bars included in the combined torsion bar is increased for a torsion bar farther from the rotation axis as compared a torsion bar closer to the rotation axis, so that rigidity of the combined torsion bar in the mirror plane perpendicular direction is improved without lowering rigidity of the combined torsion bar in the movable portion rotating direction.

Therefore, in the optical deflector according to this embodiment, resistance of the movable portion relative to a load in the mirror plane perpendicular direction is improved without lowering the drive sensitivity.

Each structure in the first embodiment described above can be modified or changed in many ways. For example, although the movable portion and the combined torsion bar are made of silicon, they may be formed by using, e.g., polysilicon, oxide silicon, or a nitride silicon film. Further, a material of the fixed electrodes is gold, but the present invention is not limited thereto, and a conductive material such as platinum, aluminum, or copper may be used. Furthermore, although an example of a parallel plate type electrostatic drive has been described as driving means, but the same effect is obtained irrespective of a drive method such as a comb tooth type electrostatic drive, electromagnetic drive, or piezoelectric drive, and hence the drive method is not limited. The dimensions and others described in connection with FIGS. 8 to 12 used for explaining functions and effects of this first embodiment are simply set, and the dimensions may be arbitrarily set without being limited to this dimension. In this first embodiment, the rigidity in the mirror plane perpendicular direction is improved by changing the width of each torsion bar depending on a position closer to the rotation axis and a position farther from the rotation axis, but the same effect can be obtained when the thickness of each torsion bar is changed depending on a position closer to the rotation axis and a position farther from the rotation axis However, the fabrication method is complicated to partially change the width of the torsion bar. Moreover, in the configuration according to this first embodiment, the torsional rigidity can be easily adjusted by adjusting the width of each torsion bar rather than adjusting the thickness of each torsion bar. Therefore, the fabrication method is further simple, and it is preferable to improve torsional rigidity of each torsion bar by adjusting the width that can be easily modified as compared with adjusting the thickness.

Additionally, in this first embodiment, since the torsion bars with two kinds of different torsional rigidity are only arranged, the rigidity design is easy.

In case of the parallel plate type electrostatic drive, when the movable portion moves closer to the fixed electrodes, the electrostatic attractive force increases, and the movable portion largely moves in the perpendicular direction. Therefore, this embodiment is particularly effective to the parallel plate type electrostatic drive type, and the movement of the movable portion in the perpendicular direction can be effectively suppressed.

Furthermore, in this first embodiment, attention is paid to the rigidity in the mirror plane perpendicular direction, the rigidity in a mirror plane parallel direction is also improved.

<First Modification of First Embodiment>

Figure 14:
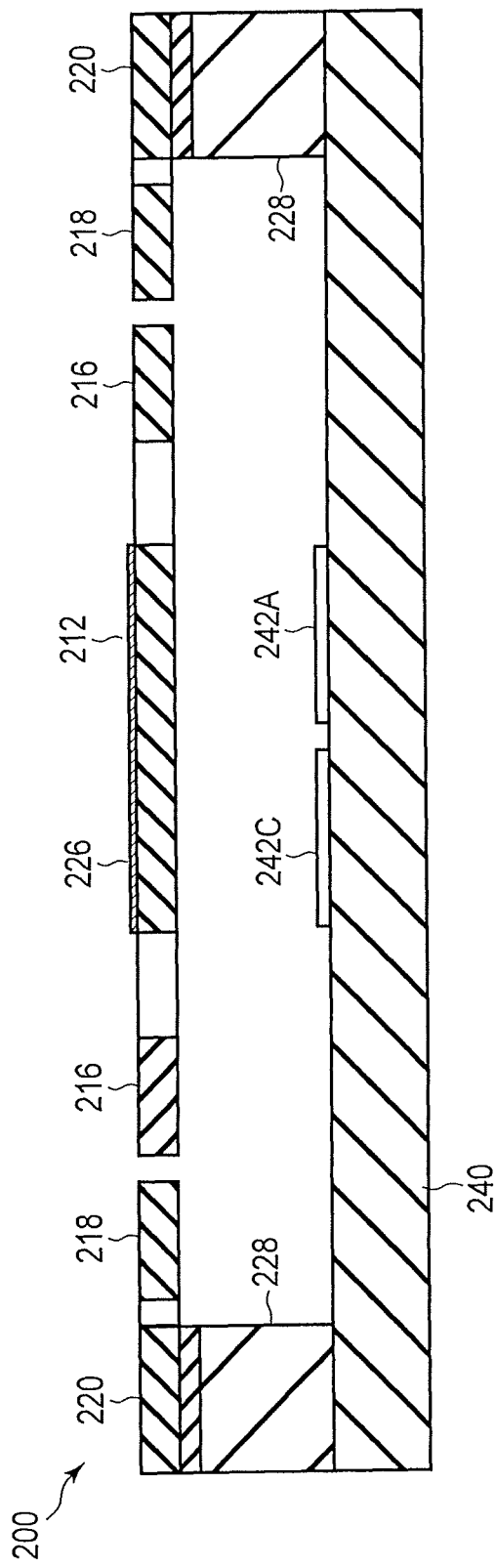
FIG. 14 is a cross-sectional view of the optical deflector taken along a line B-B in FIG. 13.

A description will be given as to an optical deflector according to a first modification of the first embodiment will now be described with reference to FIGS. 13 and 14. FIG. 13 is an exploded perspective view of the optical deflector according to the first modification of the first embodiment. FIG. 14 shows a joint cross section of the optical deflector taken along a line B-B shown in FIG. 13.

The optical deflector 200 comprises a mirror unit 210 and an electrode substrate 240.

The mirror unit 210 comprises a movable portion 212, a pair of combined torsion bars 214, a movable support portion 216, a pair of combined torsion bars 218, and a pair of fixed portions 220.

The movable portion 212 has a rectangular shape, and the movable support portion 216 has a rectangular frame shape. The shape of the movable portion 212 is not limited to the rectangular shape, and any other arbitrary shape such as a circular shape or an elliptic shape can be used. The movable support portion 216 is positioned at an interval to surround the movable portion 212, and the pair of combined torsion bars 214 are positioned between the movable support portion 216 and the movable portion 212. The pair of combined torsion bars 214 are positioned on both sides of the movable portion 212. The pair of combined torsion bars 214 mechanically connect the movable support portion 216 and the movable portion 212 to each other so that the movable portion 212 can be rotationally displaced, i.e., inclined about a rotation axis 222 with respect to the movable support portion 216.

The pair of fixed portions 220 are positioned on both sides of the movable support portion 216 at intervals, and the pair of torsion bars 218 are positioned between the pair of fixed portions 220 and the movable support portion 216. The pair of combined torsion bars 218 are positioned on both outer sides of the movable support portion 216. The pair of combined torsion bars 218 mechanically connect the fixed portions 220 and the movable support portion 216 to each other so that the movable support portion 216 can be rotationally displaced, i.e., inclined about a rotation axis 224 with respect to the fixed portions 220. The rotation axis 222 and the rotation axis 224 are orthogonal to each other.

The pair of combined torsion bars 214 are symmetrically arranged with respect to the rotation axis 224, the movable support portion 216 is symmetrically arranged relative to both the rotation axis 222 and the rotation axis 224, and the pair of combined torsion bars 218 and the pair of fixed portions 220 are symmetrically arranged relative to the rotation axis 222. The movable portion 212, the combined torsion bars 214, the movable support portion 216, the combined torsion bars 218, and the fixed portions 220 may be integrally made of, e.g., silicon. Detailed structures of the combined torsion bars 214, 218 are the same as those of the combined torsion bars 114.

The movable portion 212 has a mirror plane 226 on a surface on the opposite side of a surface facing the electrode substrate 240. The mirror plane 226 may be formed by forming a metal thin film with high reflectance on the movable portion 212. Alternatively, the mirror plane 226 may be formed by mirror-polishing a surface of the movable portion 212. Each fixed portion 220 is provided, on a surface facing the electrode substrate 240, with a spacer 228 to define an interval between the movable portion 212 and the electrode substrate 240.

The electrode substrate 240 is provided, on a surface of the facing the movable portion 212, with four fixed electrodes 242A, 242B, 242C, 242D configured to rotationally displace, namely, incline the movable portion 112 about the rotation axis 222 and the rotation axis 224. That is, the fixed electrodes 242A, 242B, 242C, 242D constitute a driver to drive the movable portion 212. This driver can drive the movable portion 212 by using electrostatic force. In the following description, the fixed electrodes 242A, 242B, 242C, 242D will be generically simply referred to as fixed electrodes 242 when they do not have to be distinguished from each other. The fixed electrodes 242 are made of, but not limited to, e.g., gold. The four fixed electrodes 242 face the movable portion 212, and they are symmetrically arranged with respect to each of two straight lines, i.e., the rotation axis 222 and the rotation axis 224 projected onto the electrode substrate 240. That is, the fixed electrodes 242A, 242B and the fixed electrodes 242C, 242D are symmetrically arranged with respect to the rotation axis 222, and the fixed electrodes 242A, 242C and the fixed electrodes 242B, 242D are symmetrically arranged with respect to the rotation axis 224.

The mirror unit 210 and the electrode substrate 240 are arranged so that the movable portion 212 faces the fixed electrodes 242, and the spacers 228 are joined to the electrode substrate 240. As a result, the fixed electrodes 242 are arranged at positions overlapping the movable portion 212 as viewed from a front direction of the movable portion 212, and they are arranged apart from the movable portion 212 as viewed from a side direction of the movable portion 212 as shown in FIG. 14. Here, the front direction of the movable portion 212 means a direction perpendicular to the mirror plane 226 of the movable portion 212 with no deflection, and the side direction of the movable portion 212 means a direction parallel to the mirror plane 226 of the movable portion 212 with no deflection.

In such an optical deflector 200, the movable portion 212 is driven as follows.

To rotationally displace, i.e., incline the movable portion 212 about the rotation axis 222, the movable portion 212 is maintained at a ground potential, and a voltage is applied to the fixed electrodes 242 positioned on one side with respect to the rotation axis 222, e.g., the fixed electrodes 242A, 241B. Electrostatic attractive force is generated between the fixed electrodes 242A, 242B to which the voltage has been applied and the movable portion 212. Intensity of the generated electrostatic attractive force is dependent on intensity of the applied voltage. The side of the movable portion 212 that faces the fixed electrodes 242A, 242B to which the voltage has been applied is attracted to the electrode substrate 240, and the side of the same facing the fixed electrodes 242C, 242D to which no voltage has been applied is moved away from the electrode substrate 140. As a result, the combined torsion bars 214 undergo torsion deformation, so that the movable portion 212 is rotationally displaced, i.e., inclined about the rotation axis 222 depending on the intensity of the applied voltage.

To rotationally displace, i.e., incline the movable portion 212 about the rotation axis 224, the movable portion 212 is maintained at a ground potential, and a voltage is applied to the fixed electrodes 242 positioned on one side with respect to the rotation axis 224, e.g., the fixed electrodes 242A, 241C. Electrostatic attractive force is generated between the fixed electrodes 242A, 242C to which the voltage has been applied and the movable portion 212. Intensity of the generated electrostatic attractive force is dependent on intensity of the applied voltage. The side of the movable portion 212 that faces the fixed electrodes 242A, 242C to which the voltage has been applied is attracted to the electrode substrate 240, and the side of the same facing the fixed electrodes 242B, 242D to which no voltage has been applied is moved away from the electrode substrate 240. As a result, the combined torsion bars 218 undergo torsion deformation, so that the movable portion 212 is rotationally displaced, i.e., inclined about the rotation axis 224 together with the combined torsion bars 214 and the movable support portion 216 depending on the intensity of the applied voltage.

In the optical deflector according to this modification, when selection of the fixed electrodes 242 to which the voltage is applied and the intensity of the voltage to be applied are controlled, the movable portion 212 can be rotationally displaced, i.e., inclined about the two rotation axes 222, 224 orthogonal to each other, and hence a beam of light reflected by the mirror plane 226 can be two-dimensionally deflected.

In the optical deflector according to this modification, the same effect as that of the optical deflector according to the first embodiment can be obtained.

Moreover, each structure described in this modification can be subjected to the various modifications or changes described in the first embodiment.

<Second Modification of First Embodiment>

Figure 16:
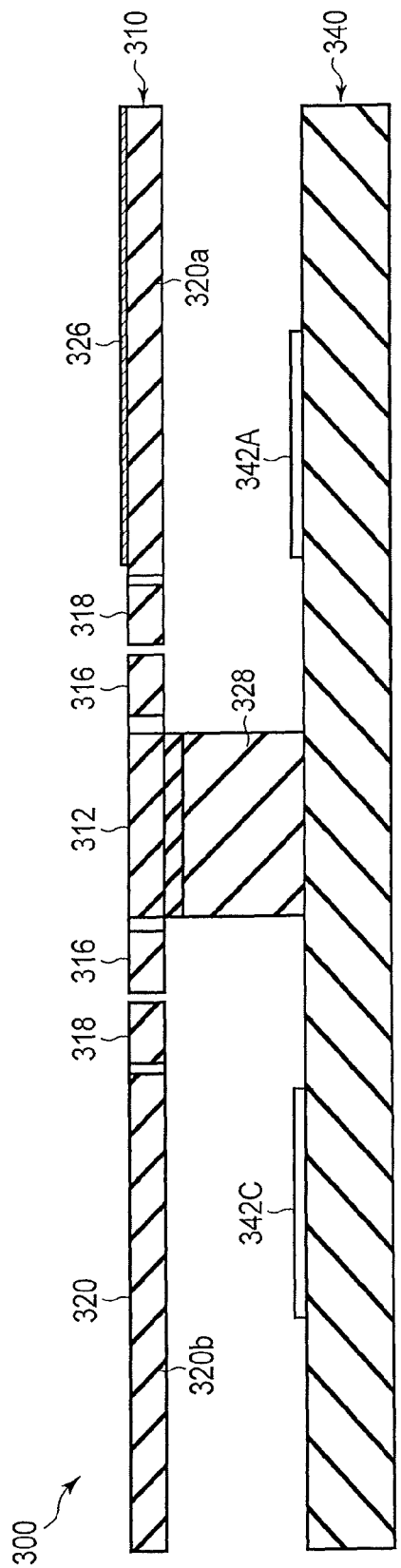
FIG. 16 is a cross-sectional view of the optical deflector taken along a line C-C in FIG. 15.

An optical deflector according to a second modification of the first embodiment will now be described with reference to FIGS. 15 and 16. FIG. 15 is an exploded perspective view of an optical deflector according to a second modification of the first embodiment. FIG. 16 shows a joint cross section of the optical deflector taken along a line C-C shown in FIG. 15.

The optical deflector 300 comprises a mirror unit 310 and an electrode substrate 340.

The mirror unit 310 comprises a fixed portion 312, a pair of combined torsion bars 314, a movable support portion 316, a pair of combined torsion bars 318, and a movable portion 320.

The fixed portion 312 has a rectangular shape, and the movable support portion 316 has a rectangular frame shape. The movable support portion 316 is positioned at an interval to surround the fixed portion 312, and the pair of combined torsion bars 314 are positioned between the movable support portion 316 and the fixed portion 312. The pair of combined torsion bars 314 are positioned on both sides of the fixed portion 312. The pair of combined torsion bars 314 mechanically connect the movable support portion 316 and the fixed portion 312 to each other so that the movable support portion 316 can be rotationally displaced, i.e., inclined about a rotation axis 322 with respect to the fixed portion 312.

The movable portion 320 has an opening portion and is positioned to receive the movable support portion 316 in this opening portion, and the pair of combined torsion bars 318 are positioned in the opening portion of the movable portion 320. The pair of combined torsion bars 318 are positioned on both outer sides of the movable support portion 316. The pair of combined torsion bars 318 mechanically connect the movable portion 320 and the movable support portion 316 to each other so that the movable portion 320 can be rotationally displaced, i.e., inclined about a rotation axis 324 with respect to the movable support portion 316. The rotation axis 322 and the rotation axis 324 are orthogonal to each other.

The pair of combined torsion bars 314 are symmetrically arranged with respect to the rotation axis 324, the movable support portion 316 is symmetrically arranged relative to both the rotation axis 322 and the rotation axis 324, and the pair of combined torsion bars 318 and the movable portion 320 are symmetrically arranged relative to the rotation axis 322. The fixed portion 312, the combined torsion bars 314, the movable support portion 316, the combined torsion bars 318, and the movable portion 320 may be integrally made of, e.g., silicon. Detailed structures of the combined torsion bars 314, 318 are the same as those of the combined torsion bars 114.

The movable portion 320 has a mirror plane 326 on a surface on the opposite side of a surface facing the electrode substrate 340. The mirror plane 326 is provided on at least one of two end portions 320a, 320b of the movable portion 320 that are symmetrically positioned relative to the rotation axis 322. For example, the mirror plane 326 is provided on one end portion 320a of the movable portion 320. Of course, the mirror plane 326 may be provided on the entire movable portion 320. The mirror plane 326 may be formed by forming a metal thin film with high reflectance on the movable portion 320. Alternatively, the mirror plane 226 may be formed by mirror-polishing a surface of the movable portion 320. The fixed portion 312 is provided, on a surface facing the electrode substrate 340, with a spacer 328 to define an interval between the movable portion 320 and the electrode substrate 340.

The electrode substrate 340 is provided, on a surface facing the movable portion 320, with four fixed electrodes 342A, 342B, 342C, 342D configured to rotationally displace, namely, incline the movable portion 320 about the rotation axis 322 and the rotation axis 324. That is, the fixed electrodes 342A, 342B, 342C, 342D constitute a driver to drive the movable portion 320. This driver can drive the movable portion 320 by using electrostatic force. In the following description, the fixed electrodes 342A, 342B, 342C, 342D will be generically simply referred to as fixed electrodes 342 when they do not have to be distinguished from each other. The fixed electrodes 342 are made of, but not limited to, e.g., gold. The fixed electrodes 342A, 342B face one end portion 320a of the movable portion 320, and the fixed electrodes 342C, 342D face the other end portion 320b of the movable portion 320. The fixed electrodes 342A, 342B and the fixed electrodes 342C, 342D are symmetrically arranged with respect to a straight line of the rotation axis 322 projected onto the electrode substrate 340. The fixed electrodes 342A, 342C and the fixed electrodes 342B, 342D are symmetrically arranged with respect to a straight line of the rotation axis 324 projected onto the electrode substrate 340.

The mirror unit 310 and the electrode substrate 340 are arranged so that the fixed electrodes 342 face the end portions 320a, 320b of the movable portion 320, and the spacer 328 is joined to the electrode substrate 340. As a result, the fixed electrodes 342 are arranged at positions overlapping the movable portion 320 as viewed from a front direction of the movable portion 320, and they are arranged apart from the movable portion 320 as viewed from a side direction of the movable portion 320 as shown in FIG. 16. Here, the front direction of the movable portion 320 means a direction perpendicular to the mirror plane 326 of the movable portion 320 with no deflection, and the side direction of the movable portion 320 means a direction parallel to the mirror plane 326 of the movable portion 320 with no deflection.

In such an optical deflector 300, the movable portion 320 drives as follows.

To rotationally displace, i.e., incline the movable portion 320 about the rotation axis 322, the movable portion 320 is maintained at a ground potential, and a voltage is applied to the fixed electrodes 342 positioned on one side with respect to the rotation axis 322, e.g., the fixed electrodes 342A, 341B. Electrostatic attractive force is generated between the fixed electrodes 342A, 342B to which the voltage has been applied and the movable portion 320. Intensity of the generated electrostatic attractive force is dependent on intensity of the applied voltage. The side of the movable portion 320 that faces the fixed electrodes 342A, 342B to which the voltage has been applied is attracted to the electrode substrate 340, and the side of the same facing the fixed electrodes 342C, 342D to which no voltage has been applied is moved away from the electrode substrate 340. As a result, the combined torsion bars 314 undergo torsion deformation, so that the movable portion 320 is rotationally displaced, i.e., inclined about the rotation axis 322 depending on the intensity of the applied voltage.

To rotationally displace, i.e., incline the movable portion 320 about the rotation axis 324, the movable portion 320 is maintained at a ground potential, and a voltage is applied to the fixed electrodes 342A, 342C positioned on one side with respect to the rotation axis 324. Electrostatic attractive force is generated between the fixed electrodes 342A, 342C to which the voltage has been applied and the movable portion 320. Intensity of the generated electrostatic attractive force is dependent on intensity of the applied voltage. The side of the movable portion 320 that faces the fixed electrodes 342A, 342C to which the voltage has been applied is attracted to the electrode substrate 340, and the side of the same facing the fixed electrodes 342B, 342D to which no voltage has been applied is moved away from the electrode substrate 340. As a result, the combined torsion bars 318 undergo torsion deformation, so that the movable portion 320 is rotationally displaced, i.e., inclined about the rotation axis 324 together with the combined torsion bars 314 and the movable support portion 316 depending on the intensity of the applied voltage.

In the optical deflector according to this modification, when selection of the fixed electrodes 342 to which the voltage is applied and the intensity of the voltage to be applied are controlled, the movable portion 320 can be rotationally displaced, i.e., inclined about the two rotation axes 322, 324 orthogonal to each other, and hence a beam of light reflected by the mirror plane 326 can be two-dimensionally deflected.

In the optical deflector according to this modification, the same effect as that of the optical deflector according to the first embodiment can be obtained.

Moreover, each structure described in this modification can be subjected to the various modifications or changes described in the first embodiment.

<Third Modification of First Embodiment>

Figure 17:
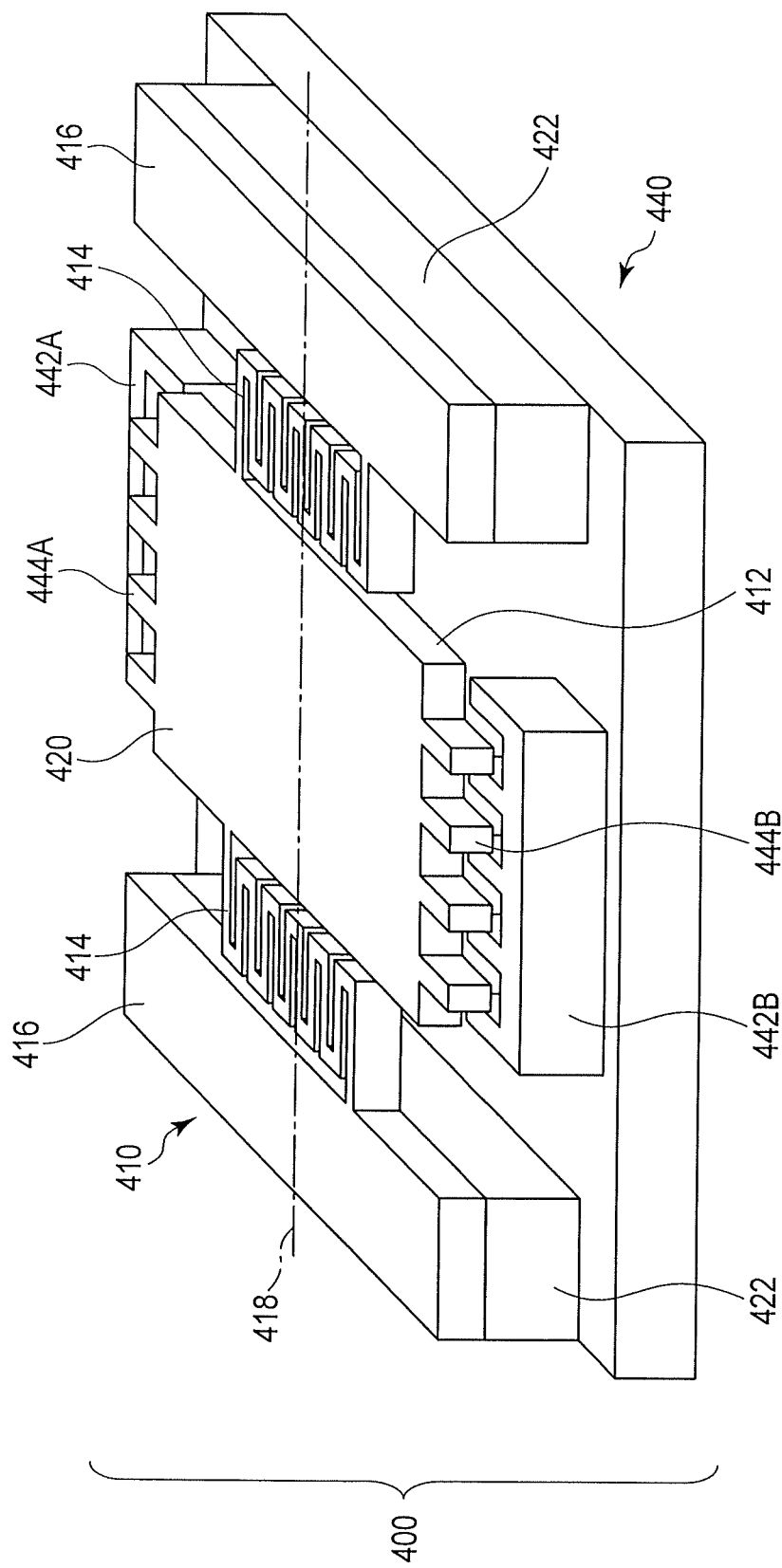
FIG. 17 is a perspective view of an optical deflector according to a third modification of the first embodiment.

An optical deflector according to a third modification of the first embodiment will now be described with reference to FIG. 17. FIG. 17 is a perspective view of an optical deflector according to a third modification of the first embodiment.

An optical deflector 400 comprises a mirror unit 410 and an electrode substrate 440.

The mirror unit 410 comprises a movable portion 412, a pair of combined torsion bars 414, and a pair of fixed portions 416. The movable portion 412 has a rectangular shape. The shape of the movable portion 412 is not limited to the rectangular shape, and any other arbitrary shape such as a circular shape or an elliptic shape may be adopted. The pair of fixed portions 416 are arranged on both sides of the movable portion 412 at an interval, and the pair of combined torsion bars 414 are positioned between the movable portion 412 and the pair of fixed portions 416. The pair of combined torsion bars 414 are positioned on both sides of the movable portion 412. The pair of combined torsion bars 414 mechanically connect the movable portion 412 and the fixed portions 416 to each other so that the movable portion 412 can be rotationally displaced, i.e., inclined about a rotation axis 418 with respect to the fixed portions 416. The movable portion 412 has sets of movable comb teeth 444A, 444B symmetrically with respect to the rotation axis 418 at both ends. The movable portion 412, the combined torsion bars 414, the sets of movable comb teeth 444A, 444B, and the fixed portions 416 may be integrally made of, e.g., silicon. The movable portion 412 has a mirror plane 420 on a surface on the opposite side of a surface facing the electrode substrate 440. The mirror plane 420 may be formed by, e.g., forming a metal thin film with high reflectance on the movable portion 412. Alternatively, the mirror plane 420 may be formed by mirror-polishing a surface of the movable portion 412. Each fixed portion 416 is provided, on a surface facing the electrode substrate 440, with a spacer 422 to define an interval between the movable portion 412 and the electrode substrate 440.

The electrode substrate 440 is provided, on a surface facing the movable portion 412, with a pair of sets of fixed comb teeth 442A, 442B configured to rotationally displace, namely, incline the movable portion 412 about the rotation axis 418 in cooperation with the pair of sets of movable comb teeth 444A, 444B. That is, the sets of fixed comb teeth 442A, 442B and the sets of movable comb teeth 444A, 444B constitute a driver to drive the movable portion 412. This driver can drive the movable portion 412 by using electrostatic force. The sets of fixed comb teeth 442A, 442B are made of, but not limited to, e.g., silicon. The detailed configuration of each combined torsion bar 414 is the same as that of the combined torsion bar 114.

The mirror unit 410 and the electrode substrate 440 are arranged so that the sets of fixed comb teeth 442A, 442B face the sets of movable comb teeth 444A, 444B, and the spacers 422 are joined to the electrode substrate 440. As a result, the sets of fixed comb teeth 442A, 442B are arranged at positions that do not overlap the movable portion 412 as viewed from a front direction of the movable portion 412. Here, the front direction of the movable portion 412 means a direction perpendicular to the mirror plane 420 of the movable portion 412 with no deflection.

In such an optical deflector 400, the movable portion 412 is driven as follows. The sets of movable comb teeth 444A, 44B are maintained at a ground potential, and a voltage is applied to one of the pair of sets of fixed comb teeth 442A, 442B on the electrode substrate 440, e.g., the set of fixed comb teeth 442A. Electrostatic attractive force is generated between the set of fixed comb teeth 442A to which the voltage has been applied and the set of movable comb teeth 444A. Intensity of the generated electrostatic attractive force is dependent on intensity of the applied voltage. The side of the movable portion 412 that faces the set of fixed comb teeth 442A to which the voltage has been applied is attracted to the electrode substrate 440, and the side of the same facing the set of fixed comb teeth 442B to which no voltage has been applied is moved away from the electrode substrate 140. As a result, the combined torsion bars 414 undergo torsion deformation, so that the movable portion 412 is rotationally displaced, i.e., inclined about the rotation axis 418 depending on the intensity of the applied voltage. As a result, a beam of light reflected by the mirror plane 420 can be one-dimensionally deflected.

In the first embodiment, the interval between the movable portion 112 and each fixed electrode 142 is determined based on a maximum rotating angle of the movable portion 112, i.e., a displacement of the end portion of the movable portion 112. The higher electrostatic attractive force can be generated when this interval is narrower but, in the first embodiment, the displacement at the movable end portion cannot be reduced, and a high application voltage is required. However, in this modification, the interval between the set of movable comb teeth 444A or 444B and the set of fixed comb teeth 442A or 442B can be narrowed irrespective of the displacement of the movable end portion, and hence a voltage can be reduced.

Further, each structure described in this modification can be subjected to the various modifications or changes described in the first embodiment.

<Fourth Modification of First Embodiment>

Figure 18:
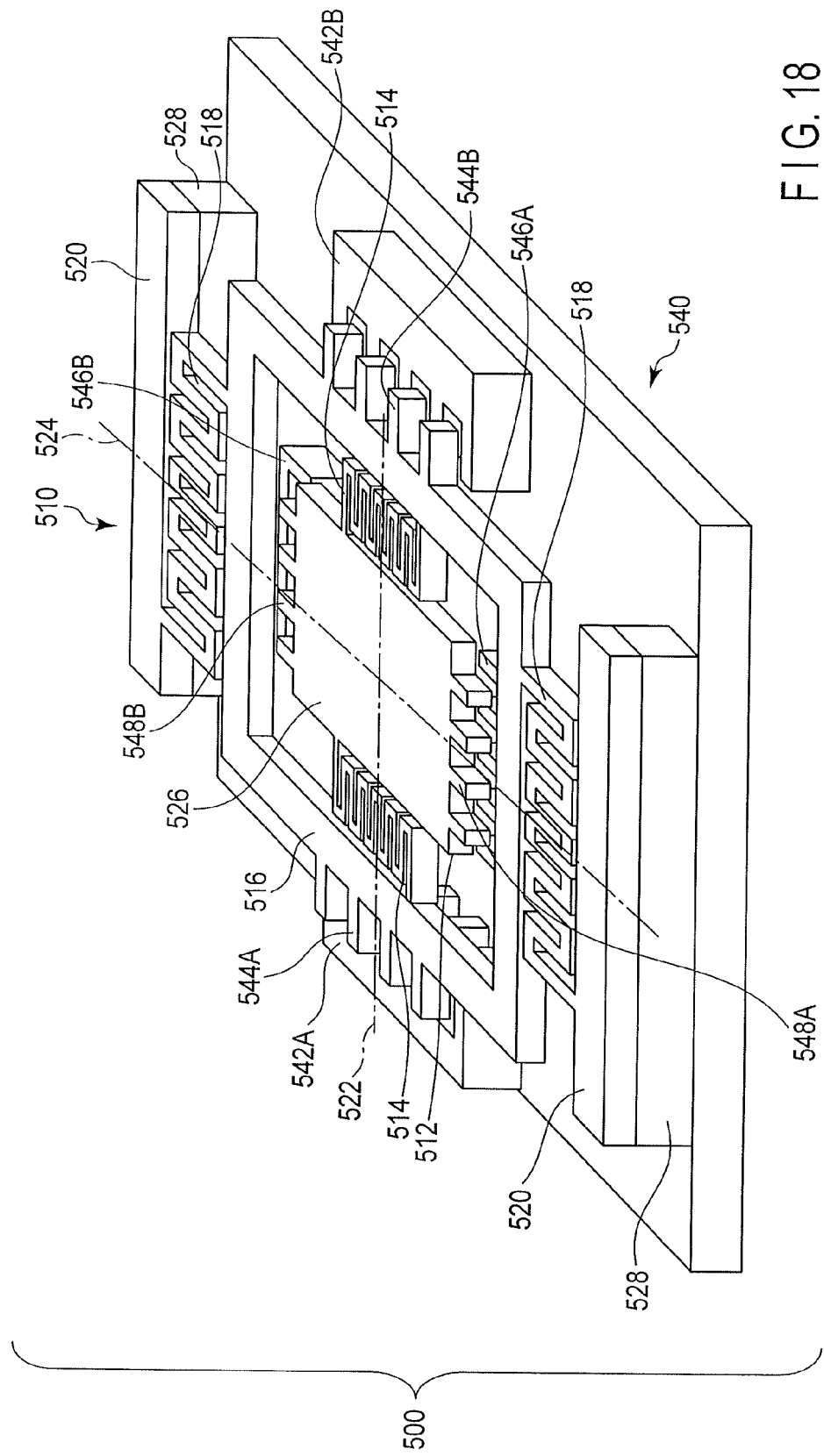
FIG. 18 is a perspective view of an optical deflector according to a fourth modification of the first embodiment.

An optical deflector according to a fourth modification of the first embodiment will now be described with reference to FIG. 18. FIG. 18 is a perspective view of an optical deflector according to a fourth modification of the first embodiment.

An optical deflector 500 comprises a mirror unit 510 and an electrode substrate 540.

The mirror unit 510 comprises a movable portion 512, a pair of combined torsion bars 514, a movable support portion 516, a pair of combined torsion bars 518, and fixed portions 520.

The movable portion 512 has a rectangular shape, and the movable support portion 516 has a rectangular frame shape. The shape of the movable portion 512 is not limited to the rectangular shape, and any other arbitrary shape such as a circular shape or an elliptic shape can be used. The movable support portion 516 is positioned at an interval to surround the movable portion 512, and the pair of combined torsion bars 514 are positioned between the movable support portion 516 and the movable portion 512. The pair of combined torsion bars 514 are positioned on both sides of the movable portion 512. The pair of combined torsion bars 514 mechanically connect the movable support portion 516 and the movable portion 512 to each other so that the movable portion 512 can be rotationally displaced, i.e., inclined about a rotation axis 522 with respect to the movable support portion 516.

The pair of fixed portions 520 are positioned on both sides of the movable support portion 516 at intervals, and the pair of combined torsion bars 518 are positioned between the pair of fixed portions 520 and the movable support portion 516. The pair of combined torsion bars 518 are positioned on both sides of the movable support portion 516. The pair of combined torsion bars 518 mechanically connect the fixed portions 520 and the movable support portion 516 to each other so that the movable support portion 516 can be rotationally displaced, i.e., inclined about a rotation axis 524 with respect to the fixed portions 520. The rotation axis 522 and the rotation axis 524 are orthogonal to each other.

The pair of combined torsion bars 514 are symmetrically arranged with respect to the rotation axis 524, the movable support portion 516 is symmetrically arranged relative to both the rotation axis 522 and the rotation axis 524, and the pair of combined torsion bars 518 and the pair of fixed portions 520 are symmetrically arranged relative to the rotation axis 522. The movable portion 512 has at both ends thereof a pair of sets of movable comb teeth 548A, 548B that are symmetrical with respect to the rotation axis 522. The movable support portion 516 has a pair of sets of movable comb teeth 544A, 544B that are symmetrical with respect to the rotation axis 524. The movable portion 512, the combined torsion bars 514, the movable support portion 516, the combined torsion bars 518, the fixed portions 520, and the sets of movable comb teeth 544A, 544B, 548A, 548B may be integrally made of, e.g., silicon. Detailed structures of the combined torsion bars 514, 518 are the same as those of the combined torsion bars 114.

The movable portion 512 has a mirror plane 526 on a surface on the opposite side of a surface facing the electrode substrate 540. The mirror plane 526 may be formed by forming a metal thin film with high reflectance on the movable portion 512. Alternatively, the mirror plane 526 may be formed by mirror-polishing a surface of the movable portion 512. Each fixed portion 520 is provided, on a surface facing the electrode substrate 540, with a spacer 528 to define an interval between the movable portion 512 and the electrode substrate 540.

The electrode substrate 540 is are provided, on a surface facing the movable portion 512, with sets of fixed comb teeth 546A, 546B configured to rotationally displace, namely, incline the movable portion 512 about the rotation axis 522. Further, sets of fixed comb teeth 542A, 542B configured to rotationally displace, i.e., incline the movable portion 512 about the rotation axis 524 are provided. That is, the sets of fixed comb teeth 542A, 542B, 546A, 546B constitute a driver to drive the movable portion 512. This driver can drive the movable portion 512 by using electrostatic force. The sets of fixed comb teeth 542A, 542B, 546A, 546B are made of, but not limited to, e.g., silicon. The two sets of fixed comb teeth 542A, 542B face the sets of movable comb teeth 544A, 544B, and they are symmetrically arranged with respect to a straight line of the rotation axis 524 projected onto the electrode substrate 540. Furthermore, the two sets of fixed comb teeth 546A, 546B face the sets of the movable comb teeth 548A, 548B, and they are symmetrically arranged with respect to a straight line of the rotation axis 522 projected onto the electrode substrate 540.

The mirror unit 510 and the electrode substrate 540 are arranged so that the sets of the movable comb teeth 544A, 544B face the sets of the fixed comb teeth 542A, 542B, the sets of the movable comb teeth 548A, 548B face the sets of the fixed comb teeth 546A, 546B, and the spacers 528 are joined to the electrode substrate 540. As a result, as viewed from a front direction of the movable portion 512, the sets of the fixed comb teeth 542A, 542B are arranged at positions that do not overlap the movable support portion 516, and the sets of the fixed comb teeth 546A, 546B are arranged at positions that do not overlap the movable portion 512. Here, the front direction of the movable portion 512 means a direction perpendicular to the mirror plane 526 of the movable portion 512 with no deflection.

In such an optical deflector 500, the movable portion 512 is driven as follows.

To rotationally displace, i.e., incline the movable portion 512 about the rotation axis 522, the respective sets of the movable comb teeth 548A, 548B are maintained at a ground potential, and a voltage is applied to a set of fixed comb teeth positioned on one side with respect to the rotation axis 522, e.g., the set of the fixed comb teeth 546A. Electrostatic attractive force is generated between the set of the fixed comb teeth 546A to which the voltage has been applied and the set of the movable comb teeth 548A. Intensity of the generated electrostatic attractive force is dependent on intensity of the applied voltage. The side of the movable portion 512 that faces the set of fixed comb teeth 546A to which the voltage has been applied is attracted to the electrode substrate 540, and the side of the same facing the set of fixed comb teeth 546B to which no voltage has been applied is moved away from the electrode substrate 540. As a result, the combined torsion bars 514 undergo torsion deformation, so that the movable portion 512 is rotationally displaced, i.e., inclined about the rotation axis 522 depending on the intensity of the applied voltage.

To rotationally displace, i.e., incline the movable portion 512 about the rotation axis 524, the sets of movable comb teeth 544A, 544B are maintained at a ground potential, and a voltage is applied to a set of fixed comb teeth positioned on one side with respect to the rotation axis 524, e.g., the set of fixed comb teeth 542A. Electrostatic attractive force is generated between the set of fixed comb teeth 542A to which the voltage has been applied and the set of movable comb teeth 544A. Intensity of the generated electrostatic attractive force is dependent on intensity of the applied voltage. The side of the movable support portion 516 that faces the set of fixed comb teeth 542A to which the voltage has been applied is attracted to the electrode substrate 540, and the side of the same facing the set of fixed comb teeth 542B to which no voltage has been applied is moved away from the electrode substrate 540. The combined torsion bars 518 connecting the movable support portion 516 and the fixed portions 520 to each other undergo torsion deformation, so that the movable support portion 516 is rotationally displaced, i.e., inclined about the rotation axis 524 depending on the intensity of the applied voltage. As a result, the movable portion 512 is rotationally displaced, i.e., inclined about the rotation axis 524 together with the movable support portion 516 and the combined torsion bar 514.

In the optical deflector according to this modification, when selection of the respective sets of fixed comb teeth 542A, 542B, 546A, 546B to which the voltage is applied and the intensity of the voltage to be applied are controlled, the movable portion 512 can be rotationally displaced, i.e., inclined about the two rotation axes 522, 524 orthogonal to each other, and hence a beam of light reflected by the mirror plane 526 can be two-dimensionally deflected.

In the optical deflector according to this modification, the same effect as that of the optical deflector according to the third modification can be obtained.

Moreover, each structure described in this modification can be subjected to the various modifications or changes described in the first modification.

<Fifth Modification of First Embodiment>

Figure 19:
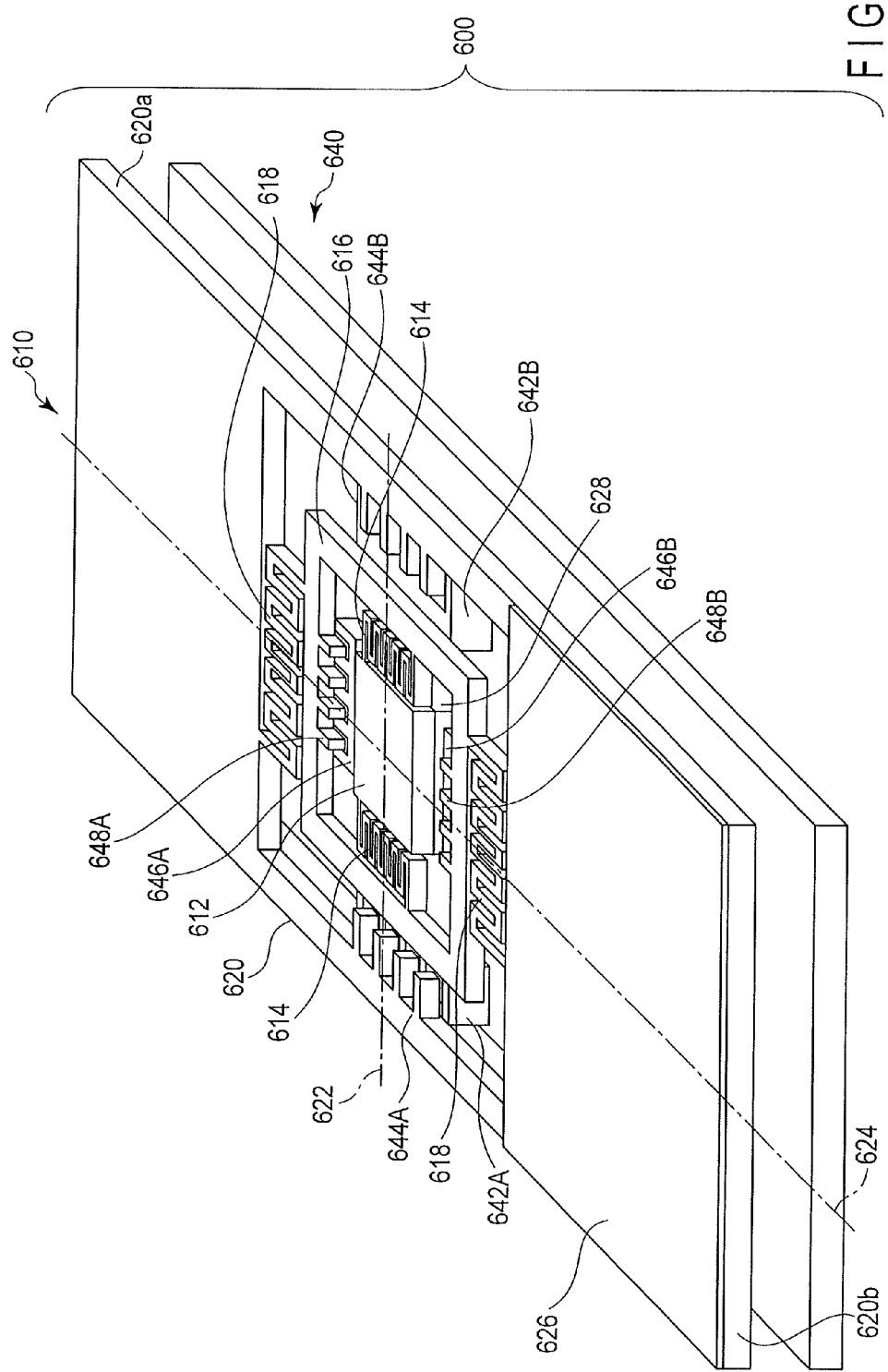
FIG. 19 is a perspective view of an optical deflector according to a fifth modification of the first embodiment.

An optical deflector according to a fifth modification of the first embodiment will now be described with reference to FIG. 19. FIG. 19 is a perspective view of an optical deflector according to a fifth modification of the first embodiment.

An optical deflector 600 comprises a mirror unit 610 and an electrode substrate 640.

The mirror unit 610 comprises a fixed portion 612, a pair of combined torsion bars 614, a movable support portion 616, a pair of combined torsion bars 618, and a movable portion 620.

The fixed portion 612 has a rectangular shape, and the movable support portion 616 has a rectangular frame shape. The movable support portion 616 is positioned at an interval to surround the fixed portion 612, and the pair of combined torsion bars 614 are positioned between the movable support portion 616 and the fixed portion 612. The pair of combined torsion bars 614 are positioned at both ends of the fixed portion 612. The pair of combined torsion bars 614 mechanically connect the movable support portion 616 and the fixed portion 612 to each other so that the movable support portion 616 can be rotationally displaced, i.e., inclined about a rotation axis 622 with respect to the fixed portion 612.

The movable portion 620 has an opening portion on the inner side and is positioned to receive the movable support portion 616 in this opening portion, and the pair of combined torsion bars 618 are positioned in the opening portion of the movable portion 620. The pair of combined torsion bars 618 are positioned on both sides of the movable support portion 616. The pair of combined torsion bars 618 mechanically connect the movable portion 620 and the movable support portion 616 to each other so that the movable portion 620 can be rotationally displaced, i.e., inclined about a rotation axis 624 with respect to the movable support portion 616. The rotation axis 622 and the rotation axis 624 are orthogonal to each other.

The pair of combined torsion bars 614 are symmetrically arranged with respect to the rotation axis 624, the movable support portion 616 is symmetrically arranged relative to the rotation axis 622 and the rotation axis 624, and the pair of combined torsion bars 618 and the movable portion 620 are symmetrically arranged relative to the rotation axis 622. The movable portion 620 has at both ends in the opening thereof a pair of sets of movable comb teeth 644A, 644B that are symmetrical with respect to the rotation axis 624. The movable support portion 616 has at both ends in the opening thereof a pair of sets of movable comb teeth 648A, 648B that are symmetrical with respect to the rotation axis 622. The fixed portion 612, the combined torsion bars 614, the movable support portion 616, the combined torsion bars 618, the movable portion 620, and the sets of movable comb teeth 644A, 644B, 648A, 648B may be integrally made of, e.g., silicon. Detailed structures of the combined torsion bars 614, 618 are the same as those of the combined torsion bars 114.

The movable portion 620 has a mirror plane 626 on a surface on the opposite side of a surface facing the electrode substrate 640. The mirror plane 626 is provided on at least one of two end portions 620a, 620b of the movable portion 620 that are symmetrically positioned relative to the rotation axis 622. Of course, the mirror plane 626 may be provided on the entire movable portion 620. The mirror plane 626 may be formed by, e.g., forming a metal thin film with high reflectance at an end portion 620b of the movable portion. Alternatively, the mirror plane 626 may be formed by mirror-polishing a surface of the movable portion 620. The fixed portion 612 is provided, on a surface facing the electrode substrate 640, with a spacer 628 to define an interval between the movable portion 620 and the electrode substrate 640.

The electrode substrate 640 is provided, on a surface facing the movable portion 620, with two sets of fixed comb teeth 642A, 642B configured to rotationally displace, namely, incline the movable portion 620 about the rotation axis 624. Further, two sets of fixed comb teeth 646A, 646B configured to rotationally displace, i.e., incline the movable portion 620 about the rotation axis 622 are provided. The sets of fixed comb teeth 642A, 642B, 646A, 646B are made of, but not limited to, e.g., silicon. The sets of fixed comb teeth 642A, 642B face the sets of movable comb teeth 644A, 644B, and the sets of fixed comb teeth 646A, 646B face the sets of movable comb teeth 648A, 648B. The sets of fixed comb teeth 642A, 642B are symmetrically arranged with respect to a straight line of the rotation axis 624 projected onto the electrode substrate 640. The sets of fixed comb teeth 646A, 646B are symmetrically arranged with respect to a straight line of the rotation axis 622 projected onto the electrode substrate 640. The sets of fixed comb teeth 646A, 646B are symmetrically arranged with respect to a straight line of the rotation axis 622 projected onto the electrode substrate 640.

The mirror unit 610 and the electrode substrate 640 are arranged so that the sets of fixed comb teeth 642A, 642B face the sets of movable comb teeth 644A, 644B, the sets of fixed comb teeth 646A, 646B face the sets of movable comb teeth 648A, 648B, and the spacer 628 is joined to the electrode substrate 640. As a result, as viewed from a front direction of the movable portion 620, the sets of fixed comb teeth 642A, 642B are arranged at positions that do not overlap the movable portion 620, and the sets of fixed comb teeth 646A, 646B are arranged at positions that do not overlap the movable support portion 616. Here, the front direction of the movable portion 620 means a direction perpendicular to the mirror plane 626 of the movable portion 620 with no deflection.

In such an optical deflector 600, the movable portion 620 is driven as follows.

To rotationally displace, i.e., incline the movable portion 620 about the rotation axis 624, the respective sets of movable comb teeth 644A, 644B are maintained at a ground potential, and a voltage is applied to a set of fixed comb teeth positioned on one side with respect to the rotation axis 624, e.g., the set of fixed comb teeth 642A. Electrostatic attractive force is generated between the set of fixed comb teeth 642A to which the voltage has been applied and the set of movable comb teeth 644A. Intensity of the generated force is dependent on intensity of the applied voltage. The side of the movable portion 620 that faces the set of fixed comb teeth 642A to which the voltage has been applied is attracted to the electrode substrate 640, and the side of the same facing the set of fixed comb teeth 642B to which no voltage has been applied is moved away from the electrode substrate 640. As a result, the combined torsion bars 618 undergo torsion deformation, so that the movable portion 620 is rotationally displaced, i.e., inclined about the rotation axis 624 depending on the intensity of the applied voltage.

To rotationally displace, i.e., incline the movable portion 620 about the rotation axis 622, the sets of movable comb teeth 648A, 648B are maintained at a ground potential, and a voltage is applied to a set of fixed comb teeth 646A positioned on one side with respect to the rotation axis 622. Electrostatic attractive force is generated between the set of fixed comb teeth 646A to which the voltage has been applied and the set of movable comb teeth 648A. Intensity of the generated electrostatic attractive force is dependent on intensity of the applied voltage. The side of the movable support portion 616 that faces the set of fixed comb teeth 646A to which the voltage has been applied is attracted to the electrode substrate 640, and the side of the same facing the set of fixed comb teeth 646B to which no voltage has been applied is moved away from the electrode substrate 640. The combined torsion bars 614 connecting the movable support portion 616 and the fixed portions 612 to each other undergo torsion deformation, so that the movable support portion 616 is rotationally displaced, i.e., inclined about the rotation axis 622 depending on the intensity of the applied voltage. As a result, the movable portion 620 connected to the movable support portion 616 through the combined torsion bars 618 is rotationally displaced, i.e., inclined about the rotation axis 622 together with the movable support portion 616 and the combined torsion bars 618.

In the optical deflector according to this modification, when selection of the respective sets of fixed comb teeth 642A, 642B, 646A, 646B to which the voltage is applied and the intensity of the voltage to be applied are controlled, the movable portion 620 can be rotationally displaced, i.e., inclined about the two rotation axes 622, 624 orthogonal to each other, and hence a beam of light reflected by the mirror plane 626 can be two-dimensionally deflected.

In the optical deflector according to this modification, the same effect as that in the third modification can be obtained.

Moreover, each structure described in this modification can be subjected to the various modifications or changes described in the second modification.

<Sixth Modification of First Embodiment>

Figure 20:
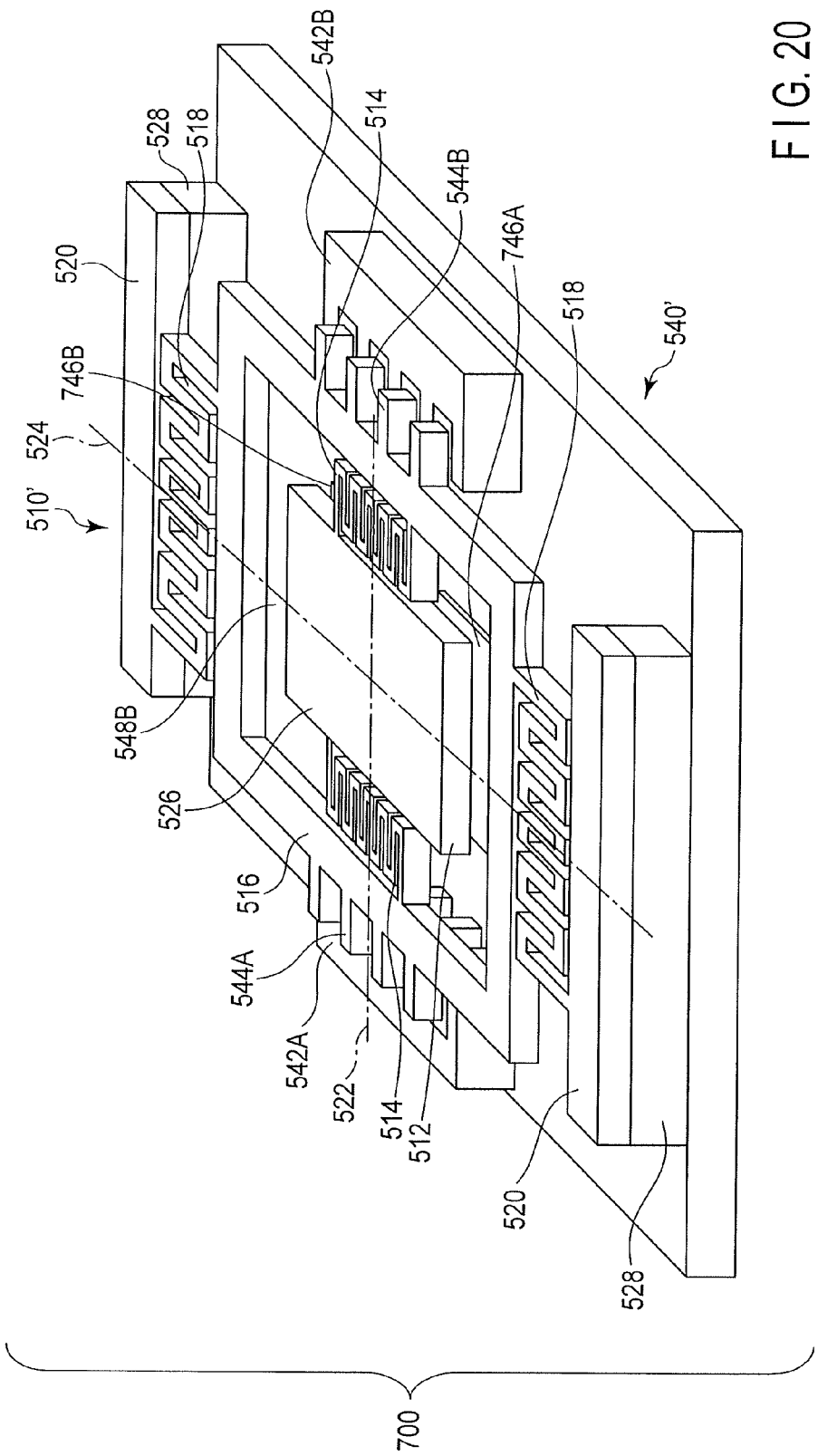
FIG. 20 is a perspective view of an optical deflector according to a sixth modification of the first embodiment.

An optical deflector according to a sixth modification of the first embodiment will now be described with reference to FIG. 20. FIG. 20 is a perspective view of an optical deflector according to a sixth modification of the first embodiment.

An optical deflector 700 comprises a mirror unit 510' and an electrode substrate 540'.

The mirror unit 510' is similar to the mirror unit 510 according to the fourth modification of the first embodiment, and it has a configuration obtained by eliminating the sets of movable comb teeth 548A, 548B from the mirror unit 510.

The electrode substrate 540' is similar to the electrode substrate 540 according to the fourth modification of the first embodiment, and it has a configuration where fixed electrodes 746A, 746B are provided in place of the sets of fixed comb teeth 546A, 546B of the electrode substrate 540.

Therefore, configurations of a movable portion 512, combined torsion bars 514, a movable support portion 516, combined torsion bars 518, fixed portions 520, a mirror plane 526, sets of movable comb teeth 544A, 544B, and sets of fixed comb teeth 542A, 542B are the same as those in the fourth modification according to the first embodiment.

The electrode substrate 540' is provided, on a surface facing the movable portion 512, with the two fixed electrodes 746A, 746B configured to rotationally displace, namely, incline the movable portion 512 about the rotation axis 522. The fixed electrodes 746A, 746B are made of, but not limited to, e.g., gold. The two fixed electrodes 746A, 746B face the movable portion 512 and are symmetrically arranged with respect to a straight line of the rotation axis 522 projected onto the electrode substrate 540'.

The mirror unit 510' and the electrode substrate 540' are arranged so that the fixed electrodes 746A, 746B face the movable portion 512, the sets of movable comb teeth 544A, 544B and the sets of fixed comb teeth 542A, 542B are arranged to face each other, and spacers 528 are joined to the electrode substrate 540'. As a result, the fixed electrodes 746A, 746B are arranged at positions overlapping the movable portion 512 as viewed from a front direction of the movable portion 512, and they are arranged apart from the movable portion 512 as viewed from a side direction of the movable portion 512. Furthermore, the sets of fixed comb teeth 542A, 542B are arranged at positions that do not overlap the movable support portion 516 as viewed from the front direction of the movable portion 512.

In such an optical deflector 700, the movable portion 512 is driven as follows.

To rotationally displace, i.e., incline the movable portion 512 about the rotation axis 522, the movable portion 512 is maintained at a ground potential, and a voltage is applied to a fixed electrode positioned on one side with respect to the rotation axis 522, e.g., the fixed electrode 746A. Electrostatic attractive force is generated between the fixed electrode 746A to which the voltage has been applied and the movable portion 512. Intensity of the generated electrostatic attractive force is dependent on intensity of the applied voltage. The side of the movable portion 512 that faces the fixed electrode 746A to which the voltage has been applied is attracted to the electrode substrate 540', and the side of the same facing the fixed electrode 746B to which no voltage has been applied is moved away from the electrode substrate 540'. As a result, the combined torsion bars 514 undergo torsion deformation, so that the movable portion 512 is rotationally displaced, i.e., inclined about the rotation axis 522 depending on the intensity of the applied voltage.

A method for rotating and displacing, i.e., inclining the movable portion 512 about the rotation axis 524 is the same as the fourth modification of the first embodiment.

In the optical deflector according to this modification, when selection of the respective sets of fixed comb teeth 542A, 542B and the fixed electrodes 746A, 746B to which the voltage is applied and the intensity of application are controlled, the movable portion 512 can be rotationally displaced, i.e., inclined about the two rotation axes 522, 524 orthogonal to each other, and hence a beam of light reflected by the mirror plane 526 can be two-dimensionally changed.

In the optical deflector according to this modification, the same effect as that in the third modification can be obtained.

Moreover, each structure described in this modification can be subjected to the various modifications or changes described in the first modification.

<Seventh Modification of First Embodiment>

Figure 21:
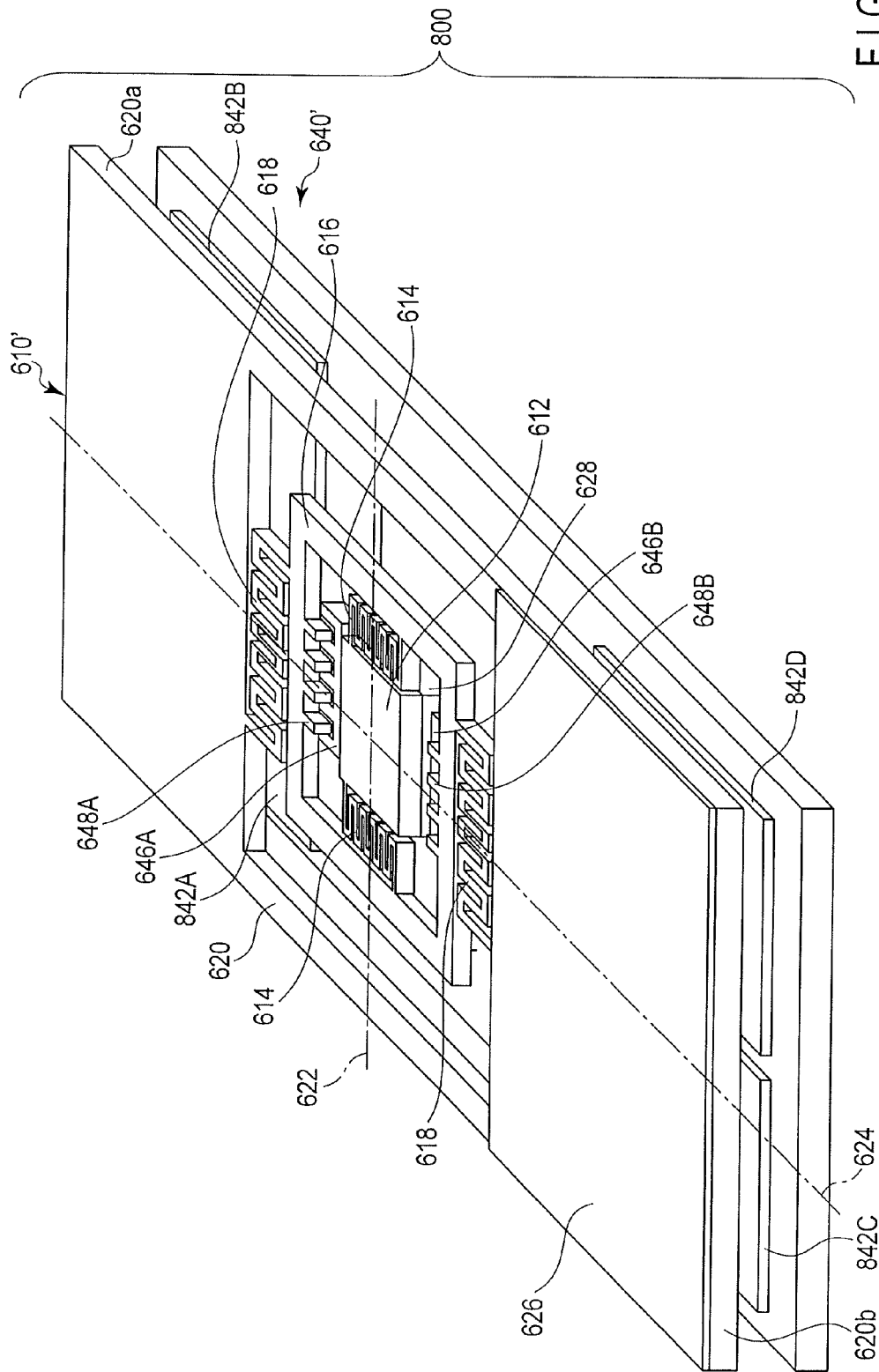
FIG. 21 is a perspective view of an optical deflector according to a seventh modification of the first embodiment.

An optical deflector according to a seventh modification of the first embodiment will now be described with reference to FIG. 21. FIG. 21 is a perspective view of an optical deflector according to the seventh modification of the first embodiment.

An optical deflector 800 comprises a mirror unit 610' and an electrode substrate 640'.

The mirror unit 610' is similar to the mirror unit 610 according to the fifth modification of the first embodiment, and it has a configuration obtained by eliminating the sets of movable comb teeth 644A, 644B from the mirror unit 610.

The electrode substrate 640' is similar to the electrode substrate 640 according to the fifth modification of the first embodiment, and it has a configuration where fixed electrodes 842A, 842B, 842C, 842D are provided in place of the sets of fixed comb teeth 642A, 642B of the electrode substrate 640.

Therefore, configurations of a fixed portion 612, combined torsion bars 614, a movable support portion 616, combined torsion bars 618, a movable portion 620, a mirror plane 626, sets of movable comb teeth 648A, 648B, and sets of fixed comb teeth 646A, 646B are the same as those in the fifth modification according to the first embodiment.

The electrode substrate 640' is provided, on a surface facing the movable portion 620, with four fixed electrodes 842A, 842B, 842C, 842D configured to rotationally displace, namely, incline the movable portion 620 about the rotation axis 624. The fixed electrodes 842A, 842B, 842C, 842D are made of, but not limited to, e.g., gold. The fixed electrodes 842A, 842B face one end portion 620a of the movable portion 620, and the fixed electrodes 842C, 842D face the other end portion 620b of the movable portion 620. The fixed electrodes 842A, 842B and the fixed electrodes 842C, 842D are symmetrically arranged relative to a straight line of the rotation axis 622 projected onto the electrode substrate 640'. The fixed electrodes 842A, 842C and the fixed electrodes 842B, 842D are symmetrically arranged with respect to a straight line of the rotation axis 624 projected onto the electrode substrate 640'.

The mirror unit 610' and the electrode substrate 640' are arranged so that the fixed electrodes 842A, 842B face the end portion 620a of the movable portion 620, the fixed electrodes 842C, 842D are arranged to face the end portion 620b of the movable portion 620, the sets of movable comb teeth 648A, 648B and the sets of fixed comb teeth 646A, 646B are arranged to face each other, and spacers 628 are joined to the electrode substrate 640'. As a result, the fixed electrodes 842A, 842B, 842C, 842D are arranged at positions overlapping from the movable portion 620 as viewed from a front direction of the movable portion 620, and they are arranged at intervals from the movable portion 620 as viewed from a side direction of the movable portion 620. The sets of fixed comb teeth 646A, 646B are arranged at positions that do not overlap the movable support portion 616 as viewed from the front direction of the movable portion 620.

In such an optical deflector 800, the movable portion 620 is driven as follows.

The method of rotating and displacing, i.e., inclining the movable portion 620 about the rotation axis 622 is the same as the fifth modification of the first embodiment.

To rotationally displace, i.e., incline the movable portion 620 about the rotation axis 624, the movable portion 620 is maintained at a ground potential, and the same voltage is applied to the fixed electrodes 842A, 842C positioned on one side with respect to the rotation axis 624. Electrostatic attractive force is generated between the fixed electrodes 842A, 842C to which the voltage has been applied and the movable portion 620. Intensity of the generated electrostatic attractive force is dependent on intensity of the applied voltage. The side of the movable portion 620 that faces the fixed electrodes 842A, 842C to which the voltage has been applied is attracted to the electrode substrate 640', and the side of the same facing the fixed electrodes 842B, 842D to which no voltage has been applied is moved away from the electrode substrate 640'. As a result, the combined torsion bars 618 undergo torsion deformation, so that the movable portion 620 is rotationally displaced, i.e., inclined about the rotation axis 624.

In the optical deflector according to this modification, when selection of the fixed electrodes 842A, 842B, 842C, 842D and the respective sets of fixed comb teeth 646A, 646B to which the voltage is applied and the intensity of the voltage to be applied are controlled, the movable portion 620 can be rotationally displaced, i.e., inclined about the two rotation axes 622, 624 orthogonal to each other, and hence a beam of light reflected by the mirror plane 626 can be two-dimensionally deflected.

In the optical deflector according to this modification, the same effect as that in the third modification can be obtained.

Moreover, each structure described in this modification can be subjected to the various modifications or changes described in the second modification.

Second Embodiment

Figure 22:
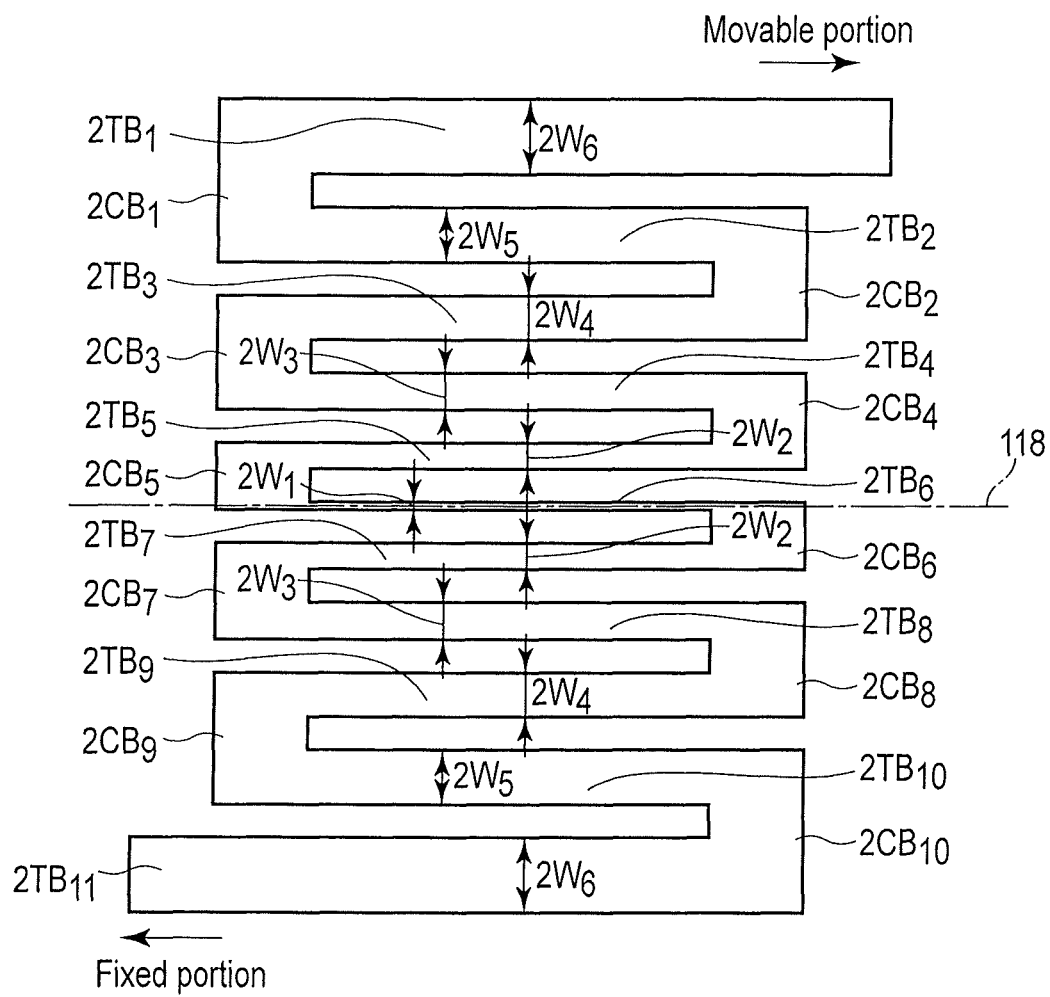
FIG. 22 is a plan view of a combined torsion bar according to a second embodiment.

A second embodiment will now be described with reference to FIG. 22. This second embodiment aims at another combined torsion bar that can be applied in place of the combined torsion bar according to the first embodiment. FIG. 22 is a plan view of one combined torsion bar according to the second embodiment.

As shown in FIG. 22, a combined torsion bar comprises an odd number of torsion bars $2TB_1$-$2TB_{11}$ and a plurality of connecting bars $2CB_1$-$2CB_{10}$. The torsion bars $2TB_1$-$2TB_{11}$ extend to be parallel to each other. Each of the connecting bars $2CB_1$-$2CB_{10}$ connects one ends of each adjacent two of the torsion bars $12B_1$-$2TB_{11}$ to each other. That is, the connecting bar $2CB_n$ (n is a natural number that is not greater than 10) connects one ends of the two torsion bars $2TB_n$, $2TB_{n+1}$ to each other. The other ends of the two torsion bars $2TB_1$, $2TB_{11}$ positioned on the outermost side, i.e., ends that are not connected to the connecting bars $2CB_1$, $2CB_{10}$ are connected to the movable portion 112 and the fixed portion 116, respectively. The torsion bars $2TB_1$-$2TB_{11}$ and the connecting bars $2CB_1$-$2CB_{10}$ may be integrally made of, e.g., silicon.

The torsion bars $2TB_1$-$2TB_{11}$ are symmetrically arranged in the alignment direction with the rotation axis 118 at the center. That is, the torsion bars $2TB_1$-$2TB_5$ and the torsion bars $2TB_{11}$-$2TB_7$ are symmetrically arranged with $2TB_6$ positioned on the rotation axis 118 at the center. In the torsion bars $2TB_1$-$2TB_{11}$, a torsion bar farther from the rotation axis 118 has higher torsion rigidity than a torsion bar closer to the rotation axis 118.

The torsion bars $2TB_1$-$2TB_{11}$ extend to be parallel to the rotation axis 118, and they are aligned in the direction perpendicular to the rotation axis 118. The connecting bars $2CB_1$-$2CB_{10}$ extend in the alignment direction of the torsion bars $2TB_1$-$2TB_{11}$. Here, the terms "parallel" and "vertical" are not strictly limited to precise parallelism and verticality, and a range that apparent parallelism and verticality can be recognized by a commonsense judgment in this field is allowed. For example, parallelism may fall within the range of 0±3 degrees, verticality may fall within the range of 90±3 degrees.

The torsion bars $2TB_1$-$2TB_{11}$ and the connecting bars $2CB_1$-$2CB_{10}$ all have the same thickness t. The torsion bar $2TB_6$ positioned at a central portion, i.e., on the rotation axis 118 has a width $2W_1$, the torsion bars $2TB_5$, $2TB_7$ positioned on both sides thereof have a width of $2W_2$, the torsion bars $2TB_4$, $2TB_8$ positioned on the outer side thereof have a width $2W_3$, the torsion bars $2TB_3$, $2TB_9$ positioned on the outer side thereof have a width $2W_4$, the torsion bars $2TB_2$, $2TB_{10}$ positioned on the outer side thereof have a width $2W_5$, the torsion bars $2TB_1$, $2TB_{11}$ positioned on the outer side thereof have a width $2W_6$, and $2W_1 < 2W_2 < 2W_3 < 2W_4 < 2W_5 < 2W_6$ is achieved. That is, in the torsion bars $2TB_1$-$2TB_{11}$, a torsion bar farther from the rotation axis 118 has higher torsional rigidity.

In the optical deflector according to the first embodiment, when the rotational displacement, i.e., the inclination of the movable portion 112 is extremely high, stress may possibly concentrate on a boundary between a region of narrow torsion bars and a region of thick torsion bars, thereby leading to damage. As shown in FIG. 10, as can be understood from a result of analysis using conventional combined torsion bars, a stress distribution when the movable portion 112 has moved in a fixed electrode direction increases as getting away from the rotation axis 118. In this embodiment, the torsion bars $2TB_1$-$2TB_{11}$ are formed so that they become gradually thicker, e.g., their widths become wider as getting away from the rotation axis 118 in accordance with this stress distribution. With this configuration, stress concentration hardly occurs, and the optical deflector that is hardly broken can be provided.

Each structure in the second embodiment described above can be modified or changed in many ways. For example, although the movable portion and the combined torsion bar are made of silicon, they may be formed by using, e.g., polysilicon, oxide silicon, or a nitride silicon film. In this second embodiment, the rigidity in the mirror plane perpendicular direction is improved by changing the width of each torsion bar depending on a position closer to the rotation axis and a position farther from the rotation axis, but the same effect can be obtained when the thickness of each torsion bar is changed depending on a position closer to the rotation axis and a position farther from the rotation axis. However, the fabrication method becomes complicated in order to partially change the width of the torsion bar. Moreover, in the configuration according to this second embodiment, the torsional rigidity can be easily adjusted by adjusting the width of each torsion bar rather than adjusting the thickness of each torsion bar. Therefore, the fabrication method is further simple, and it is preferable to improve torsional rigidity of each torsion bar by adjusting the width that can be easily modified as compared with adjusting the thickness.

In case of the parallel plate type electrostatic drive, when the movable portion moves closer to the fixed electrodes, the electrostatic attractive force increases, and the movable portion largely moves in the perpendicular direction. Therefore, this embodiment is particularly effective to the parallel plate electrostatic drive type, and the movement of the movable portion in the perpendicular direction can be effectively suppressed.

Furthermore, in this second embodiment, attention is paid to the rigidity in the mirror plane perpendicular direction, the rigidity in a mirror plane parallel direction is also improved.

Third Embodiment

Figure 23:
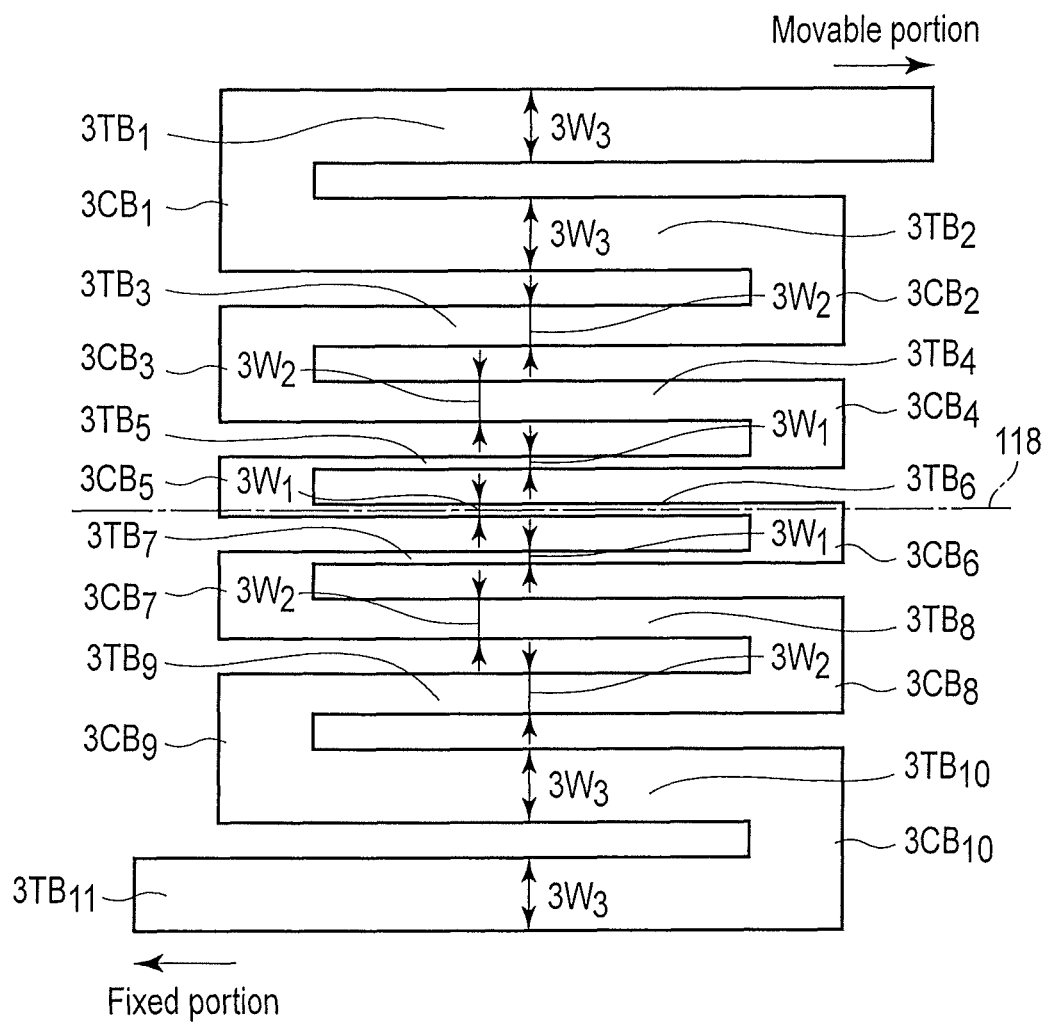
FIG. 23 is a plan view of a combined torsion bar according to a third embodiment.

A third embodiment will now be described with reference to FIG. 23. This third embodiment aims at another torsion bar that can be applied in place of the combined torsion bar according to the first embodiment. FIG. 23 is a plan view of one combined torsion bar according to the third embodiment.

As shown in FIG. 23, a combined torsion bar comprises an odd number of torsion bars $3TB_1$-$3TB_{11}$ and a plurality of connecting bars $3CB_1$-$3CB_{10}$. The torsion bars $3TB_1$-$3TB_{11}$ extend to be parallel to each other. Each of the connecting bars $3CB_1$-$3CB_{10}$ connects one ends of each adjacent two of the torsion bars $3TB_1$-$3TB_{11}$ to each other. That is, the connecting bar $3CB_n$ (n is a natural number that is not greater than 10) connects one ends of the two torsion bars $3TB_n$, $3TB_{n+1}$ to each other. The other ends of the two torsion bars $3TB_1$, $3TB_{11}$ positioned on the outermost side, i.e., ends that are not connected to the connecting bars $3CB_1$, $3CB_{10}$ are connected to the movable portion 112 and the fixed portion 116, respectively. The torsion bars $3TB_1$-$3TB_{11}$ and the connecting bars $3CB_1$-$3CB_{10}$ may be integrally made of, e.g., silicon.

The torsion bars $3TB_1$-$3TB_{11}$ are symmetrically arranged in the alignment direction with the rotation axis 118 at the center. That is, the torsion bars $3TB_1$-$3TB_5$ and the torsion bars $3TB_{11}$-$3TB_7$ are symmetrically arranged with $3TB_6$ positioned on the rotation axis 118 at the center. In the torsion bars $3TB_1$-$3TB_{11}$, a torsion bar farther from the rotation axis 118 has higher torsion rigidity than a torsion bar closer to the rotation axis 118.

The torsion bars $3TB_1$-$3TB_{11}$ extend to be parallel to the rotation axis 118, and they are aligned in the direction perpendicular to the rotation axis 118. The connecting bars $3CB_1$-$3CB_{10}$ extend in the alignment direction of the torsion bars $3TB_1$-$3TB_{11}$. Here, the terms "parallel" and "vertical" are not strictly limited to precise parallelism and verticality, and a range that apparent parallelism and verticality can be recognized by a commonsense judgment in this field is allowed. For example, parallelism may fall within the range of 0±3 degrees, verticality may fall within the range of 90±3 degrees.

The torsion bars $3TB_1$-$3TB_{11}$ and the connecting bars $3CB_1$-$3CB_{10}$ all have the same thickness t. The torsion bars $3TB_5$-$3TB_7$ positioned at a central portion have a width $3W_1$, and the torsion bars $3TB_3$, $3TB_4$; $3TB_8$, $3TB_9$ positioned on both sides thereof have a width $3W_2$, the torsion bars $3TB_1$, $3TB_2$; $3TB_{10}$, $3TB_{11}$ positioned on the outer side thereof have a width $3W_3$, and $3W_1 < 3W_2 < 3W_3$ is achieved.

Each combined torsion bar has five regions that are divided in accordance with differences between widths of the torsion bars $3TB_1$-$3TB_{11}$ and aligned in the alignment direction of the torsion bars $3TB_1$-$3TB_{11}$. The five regions include a central region or a first region positioned at the center, a pair of first lateral regions or second and third regions symmetrically arranged on both sides of the central region, and a pair of second lateral regions or fourth and fifth regions symmetrically arranged on the outer side of the first side region. The central region or the first region includes the torsion bars $3TB_5$-$3TB_7$, one first lateral region or the second region includes the torsion bars $3TB_3$, $3TB_4$, the other first lateral region or the third region includes the torsion bar $3TB_8$, $3TB_9$, one second lateral region or the fourth region includes the torsion bar $3TB_1$, $3TB_2$, and the other second lateral region or the fourth region includes the torsion bar $3TB_{10}$, $3TB_{11}$. The torsion bars $3TB_1$, $3TB_2$; $3TB_3$, $3TB_4$; $3TB_5$-$3TB_7$; $3TB_8$, $3TB_9$; $3TB_{10}$, $3TB_{11}$ in the respective regions have the same torsional rigidity, respectively. The torsion bars $3TB_5$-$3TB_7$ in the central region have the lowest torsional rigidity, and the torsion bars $3TB_1$, $3TB_2$; $3TB_3$, $3TB_4$; $3TB_8$, $3TB_9$; $3TB_{10}$, $3TB_{11}$ in the regions farther from the central region have the higher torsional rigidity. In other words, the torsional rigidity of the torsion bars $3TB_1$-$3TB_{11}$ of each combined torsion bar has a discrete distribution in the alignment direction of the torsion bars $3TB_1$-$3TB_{11}$.

In this third embodiment, the combined torsion bars have the five regions, and radial size, e.g., widths of the torsion bars in the four regions on both sides of the central region are gradually reduced in accordance with each region. This corresponds to reducing the widths of the torsion bars in the second and third regions in combined torsion bars according to the first embodiment. Therefore, a total length of each combined torsion bar according to this third embodiment can be shorter than that of each combined torsion bar according to the first embodiment. Therefore, regions occupied by the combined torsion bars can be reduced in the optical deflector, which contributes to miniaturization of the optical deflector.

Each structure in the third embodiment described above can be modified or changed in many ways. For example, although the movable portion and the combined torsion bar are made of silicon, they may be formed by using, e.g., polysilicon, oxide silicon, or a nitride silicon film. In this third embodiment, the rigidity in the mirror plane perpendicular direction is improved by changing the width of each torsion bar depending on a position closer to the rotation axis and a position farther from the rotation axis, but the same effect can be obtained when the thickness of each torsion bar is changed depending on a position closer to the rotation axis and a position farther from the rotation axis. However, the fabrication method becomes complicated to partially change the width of the torsion bar. Moreover, in the configuration according to this third embodiment, the torsional rigidity can be easily adjusted by adjusting the width of each torsion bar rather than adjusting the thickness of each torsion bar. Therefore, the fabrication method is further simple, and it is preferable to improve torsional rigidity of each torsion bar by adjusting the width that can be easily modify as compared with adjusting the thickness.

In case of the parallel plate type electrostatic drive, when the movable portion moves closer to the fixed electrodes, the electrostatic attractive force increases, and the movable portion largely moves in the perpendicular direction. Therefore, this embodiment is particularly effective to the parallel plate electrostatic drive type, and the movement of the movable portion in the perpendicular direction can be effectively suppressed.

Furthermore, in this third embodiment, attention is paid to the rigidity in the mirror plane perpendicular direction, the rigidity in a mirror plane parallel direction is also improved.

Although the embodiments according to the present invention have been described with reference to the drawings, the present invention is not limited to these embodiments, and various modifications or changes can be made without departing from the gist thereof. The various modifications or changes include embodiments as appropriate combinations of the foregoing embodiments.

Although the combined torsion bar has three region in the first embodiment and five regions in the third embodiment, it may have more odd number of regions without being limited to the above regions. That is, the combined torsion bar can have an odd number of regions aligned in the alignment direction of the torsion bars, the odd number of regions can be constituted of a central region positioned at the center and a plurality of pairs of lateral regions symmetrically arranged on both sides of the central region, the torsion bars in the respective region have the same torsional rigidity, the torsion bars in the central region have the lowest torsional rigidity, and the torsion bars in the regions farther from the central region have higher torsional rigidity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. An optical deflector comprising:
a movable portion having a mirror plane;
a fixed portion;
a pair of combined torsion bars connecting the movable portion and the fixed portion to each other so that the movable portion is rotationally displaced about a rotation axis with respect to the fixed portion; and
a driver to drive the movable portion,
each combined torsion bar comprising a plurality of torsion bars extending to be parallel to the rotation axis and a plurality of connecting bars, each of the connecting bars connecting one ends of each adjacent two of the torsion bars to each other, a torsion bar farther from the rotation axis having higher torsional rigidity than a torsion bar closer to the rotation axis.

2. The optical deflector according to claim 1, wherein each combined torsion bar has three regions aligned in an alignment direction of the torsion bars, the three regions include a central region positioned at the center and a pair of lateral regions symmetrically arranged on both sides of the central region, and torsion bars in the two lateral regions have higher torsional rigidity than torsion bars in the central region.

3. The optical deflector according to claim 1, wherein a torsion bar farther from the rotation axis has higher torsional rigidity.

4. The optical deflector according to claim 1, wherein each combined torsion bar has an odd number of regions aligned in an alignment direction of the torsion bars, the odd number of regions include a central region positioned at the center and a plurality of pairs of lateral regions symmetrically arranged on both sides of the central region, the torsion bars in each of the central and lateral region have the same torsional rigidity, the torsion bars in the central region have the lowest torsional rigidity, and the torsion bars in the lateral regions farther from the central region have the higher torsional rigidity.

5. The optical deflector according to claim 1, wherein the torsional rigidity of each torsion bar is adjusted based on a width of each torsion bar.

6. An optical deflector comprising:
a movable portion having a mirror plane;
a movable support portion;
a fixed portion;
a pair of first combined torsion bars connecting the movable portion and the movable support portion to each other so that the movable portion is rotationally displaced about a first rotation axis with respect to the movable support portion;
a pair of second combined torsion bars connecting the movable support portion and the fixed portion to each other so that the movable support portion is rotationally displaced about a second rotation axis with respect to the fixed portion; and
a driver to drive the movable portion,
each of the first and second combined torsion bars comprising a plurality of torsion bars extending to be parallel to one of the first and second rotation axes and a plurality of connecting bars, each of the connecting bars connecting one ends of each adjacent two of the torsion bars to each other, a torsion bar farther from its rotation axis having higher torsional rigidity than a torsion bar closer to its rotation axis in the corresponding torsion bars.

7. The optical deflector according to claim 1, wherein the driver drives the movable portion by using electrostatic force.

8. The optical deflector according to claim 7, wherein
the driver includes a fixed electrode,
the fixed electrode is arranged at an interval from the movable portion as viewed from a side direction of the movable portion, and
the fixed electrode is arranged at a position overlapping the movable portion as viewed from a front direction of the movable portion.

9. The optical deflector according to claim 7, wherein
the driver includes a fixed electrode, and
the fixed electrode is arranged at a position that does not overlap the movable portion as viewed from the front direction of the movable portion.

10. The optical deflector according to claim 6, wherein
the driver includes a fixed electrode, and
the fixed electrode configured to rotate about at least one of the first rotation axis and the second rotation axis is arranged at a position that does not overlap the movable portion as viewed from the front surface direction of the movable portion.

11. The optical deflector according to claim 1, wherein the plurality of torsion bars in the composite torsion bar are spaced apart from each other in a direction perpendicular to the rotation axis.

12. The optical deflector according to claim 6, wherein the plurality of torsion bars in the composite torsion bar are spaced apart from each other in a direction perpendicular to the rotation axis.

* * * * *